United States Patent [19]
Pinarbasi

[11] Patent Number: 6,086,727
[45] Date of Patent: Jul. 11, 2000

[54] METHOD AND APPARATUS TO IMPROVE THE PROPERTIES OF ION BEAM DEPOSITED FILMS IN AN ION BEAM SPUTTERING SYSTEM

[75] Inventor: Mustafa Pinarbasi, Morgan Hill, Calif.

[73] Assignee: International Business Machines Corporation, Armonk, N.Y.

[21] Appl. No.: 09/092,333

[22] Filed: Jun. 5, 1998

[51] Int. Cl.[7] .............................. C23C 14/46; B01J 19/08; B05D 5/12
[52] U.S. Cl. .............................. 204/192.11; 204/298.04; 204/298.11; 204/298.12; 204/298.13; 204/298.15; 204/298.23; 204/298.27; 204/298.28; 204/298.29; 204/192.15; 204/192.2; 204/192.21; 427/128; 427/129; 427/130; 427/131; 427/402; 427/404; 427/307
[58] Field of Search .......................... 204/298.04, 298.11, 204/298.12, 298.13, 298.15, 298.23, 298.27, 298.28, 298.29, 192.11, 192.15, 192.2, 192.3, 192.21, 192.34; 427/128, 129, 130, 131, 402, 404, 307

[56] References Cited

U.S. PATENT DOCUMENTS

| | | | |
|---|---|---|---|
| 4,315,960 | 2/1982 | Ohji et al. ............................ | 427/248.1 |
| 4,793,908 | 12/1988 | Scott et al. ......................... | 204/192.26 |
| 4,923,585 | 5/1990 | Krauss et al. ...................... | 204/298.04 |
| 5,055,318 | 10/1991 | Deutchman et al. .............. | 204/298.04 |
| 5,206,590 | 4/1993 | Dieny et al. ............................. | 324/252 |
| 5,330,628 | 7/1994 | Demaray et al. .................. | 204/192.12 |
| 5,393,398 | 2/1995 | Sugano ............................... | 204/298.11 |
| 5,492,605 | 2/1996 | Pinarbasi ........................... | 204/192.11 |

FOREIGN PATENT DOCUMENTS

| | | |
|---|---|---|
| 61-124568 | 6/1986 | Japan . |
| 2-97673 | 4/1990 | Japan . |
| 2-251143 | 10/1990 | Japan . |
| 3-202466 | 9/1991 | Japan . |
| 4-308083 | 10/1992 | Japan . |
| WO92/16014 | 9/1992 | WIPO . |

OTHER PUBLICATIONS

English translation of JP 2–251143, Oct. 1990.

*Primary Examiner*—Alan Diamond
*Attorney, Agent, or Firm*—William D. Gill

[57] ABSTRACT

An ion beam sputtering system having a chamber, an ion beam source, a multiple targets, a shutter, and a substrate stage for securely holding a wafer substrate during the ion beam sputtered deposition process in the chamber. The substrate stage is made to tilt about its vertical axis such that the flux from the targets hit the wafer substrate at a non-normal angle resulting in improved physical, electrical and magnetic properties as well as the thickness uniformity of the thin films deposited on the substrate in the ion beam sputtering system.

25 Claims, 21 Drawing Sheets

METHOD AND APPARATUS TO IMPROVE THE PROPERTIES OF ION BEAM DEPOSITED FILMS IN AN ION BEAM SPUTTERING SYSTEM

BACKGROUND OF THE INVENTION

1. Field of the Invention

This invention relates generally to the fabrication of thin films by ion beam sputter deposition and, more particularly, to the fabrication of multilayered thin film structures such as magnetoresistive sensors by ion beam sputter deposition wherein the properties of multiple layers deposited on a substrate are controlled by controlling the angle at which atoms are deposited on the substrate.

2. Description of Related Art

It is well-known in the art to utilize radio frequency (RF) or direct current (DC) magnetron sputter-deposition system for fabrication of thin film devices such as magnetic recording sensors (e.g., magnetoresistive sensors) and storage media. Such sputter-deposition systems are characterized by crossed electric and magnetic fields in an evacuated chamber into which an inert, ionizable gas, such as argon, is introduced. The gas is ionized by electrons accelerated by the electric field, which forms a plasma in proximity to a target structure. The crossed electric and magnetic fields confine the electrons in a zone between the target and substrate structures. The gas ions strike the target structure, causing ejection of atoms that are incident on a workpiece, typically a wafer substrate on which it is desired to deposit one or more layers of selected target materials.

In the conventional sputtering deposition systems relatively high operating pressures are utilized in order to obtain films having low internal stress which results in non-directional sputtering flux at the substrate. However, this non-directional flux introduces manufacturing process difficulties as device dimensions become increasingly smaller.

It is known to utilize ion beam sputter deposition in certain applications to overcome some of the difficulties encountered with conventional RF/DC sputter techniques. Several aspects of ion beam sputter deposition systems differ from conventional sputter deposition systems and provide significant advantages. For example, (1) the use of low background pressure results in less scattering of sputtered particles during the transit from the target to the wafer substrate; (2) control of the ion beam directionality provides a variable angle of incidence of the beam at the target; (3) a nearly monoenergetic beam having a narrow energy distribution provides control of the sputter yield and deposition process as a function of ion energy and enables accurate beam focusing and scanning; and (4) the ion beam is independent of target and substrate processes which allows changes in target and substrate materials and geometry while maintaining constant beam characteristics and allowing independent control of the beam energy and current density.

Apparatus and methods for depositing a thin layer of material on a substrate utilizing ion beam sputtering deposition systems are described, for example, in U.S. Pat. No. 4,923,585 ('585) to Krauss et al. and in U.S. Pat. No. 5,942,605 to Pinarbasi ('605), the contents of which are incorporated herein by reference. The '585 patent discloses the use of a computer controlled, single ion beam with a quartz crystal monitor to produce deposited films of arbitrary composition as well as layered structures of arbitrary thickness from multiple targets of different materials. The '605 patent discloses matching the ion beam gas atomic mass to the target material atomic mass to produce thin films having densities and physical properties very close to their bulk property values. While the '585 and '605 patents disclose methods for depositing multilayer films, the problems of controlling the amount of flux deposited at the junction between the layers deposited adjacent to each other is not addressed.

Ion beam sputter deposition systems have been utilized to deposit individual layers of anisotropic magnetoresistive (AMR) sensors and giant magnetoresistive (GMR) sensors for use in magnetic disk drives. In the GMR sensors, for example, the resistance of the magnetoresistive (MR) sensing layer varies as a function of the spin-dependent transmission of the conduction electrons between the ferromagnetic layers separated by a non-magnetic layer (spacer) and the accompanying spin-dependent scattering which takes place at the interface of the ferromagnetic and non-magnetic layers and within the ferromagnetic layers. GMR sensors using only two layers of ferromagnetic material (e.g., NiFe or Co or NiFe/Co) separated by a layer of GMR promoting non-magnetic metallic material (e.g., copper) are generally referred to as spin valve (SV) sensors. U.S. Pat. No. 5,206,590 to Dieny et al. ('590), the content of which is incorporated herein by reference, discloses an MR sensor operating on the principle of GMR.

Magnetoresistive (MR) sensors (AMR or GMR) are very small devices that are generally fabricated by sputtering depositions on large wafer substrates which are generally larger than 5 inches in diameter to form thousands of sensors. The wafer is subsequently diced to form individual magnetic read transducers for use in magnetic storage devices.

One of the major issues in the fabrication process of MR sensors is to precisely control the physical, electrical and magnetic properties of the junction formed between the layers deposited adjacent to each other. An example of such a junction is the contiguous junction formed between the MR layer and the longitudinal biasing layer in an MR sensor.

Another critical issue in the fabrication process of MR sensors is the thickness uniformity of each and every deposited layer over the entire utilized area of a given wafer in order to control the uniformity of operating characteristics (for example, resistance and magnetoresistance) of the entire batch of the MR sensors fabricated on said given wafer.

In an experiment by the present applicant, an ion beam sputtering system 120 (FIG. 1) was developed and used to determine the properties of the junction formed between the layers deposited adjacent to each other and thickness uniformity of various layers deposited in the end region 206 and 204 of the SV sensor 200 (FIG. 2A) formed on a 5 inch diameter wafer substrate (FIG. 3).

Referring to FIG. 1, there is shown a simplified diagram illustrating the ion beam sputter deposition system 120 developed and used by the Applicant. The ion beam sputter deposition system 120 includes a vacuum chamber 122 in which an ion beam source 121 is mounted. The ion beam system 120 further comprises selectable multiple targets 123, formed or mounted, on a rotary target support 125. An ion beam 133 provided by the ion beam source 121 is directed at one of the targets on the selectable multiple targets 123 where the impacting ions cause sputtering of the selected target material. The sputtered atoms 126 emitted from the selected target material is directed at a near-normal angle (85 to 95 degrees) onto a workpiece (wafer substrate, wafer, deposition substrate) 131 on which is formed a layer of the selected target material. The sputtered atoms 126 hit (bombard) the workpiece 131 at a near-normal angle (85 to 95 degrees). The workpiece 131 is placed securely, via clamps or vacuum suction (not shown) on a substrate stage (workpiece stage) 141. The substrate stage 141 is retrievable into a loading port 139 via a gate valve 138 for changing the workpiece 131.

A thickness monitor 137, positioned closely adjacent to the workpiece 131, provides real-time, in-situ monitoring of the thickness of the growing film during deposition over the entire utilized area of the workpiece 131. A non-movable flux regulator 150 fixed in front of the workpiece 131 partially blocks the sputtered atom flux and is used in conjunction with rotation of the workpiece 131 to improve thickness uniformity of the deposited layer during the deposition process. The non-movable flux regulator refers to a flux regulator that its position is fixed prior to the ion beam sputtering deposition of one or more deposited layers and remains fixed during the whole deposition process (i.e., the position of the flux regulator is never changed during the deposition process of said one or more deposited layers). During operation of the ion beam sputter deposition system, the vacuum chamber 122 is maintained at suitable low pressure by a vacuum pump (not shown) via port 135.

Now referring to FIG. 2A, there is shown a cross section of the SV sensor 200 having end regions 204 and 206 separated from each other by a central region 202 where Applicant's ion beam sputtering system 120 was used to deposit seed, biasing and lead layers in said end regions. A free layer (free MR layer, free ferromagnetic layer) 210 is separated from a pinned layer (pinned MR layer, pinned ferromagnetic layer) 220 by a non-magnetic, electrically-conducting spacer layer 215. Alternatively, pinned layer 220 may be made of multi layers of ferromagnetic material (e.g., cobalt, Nife) separated from each other by a metallic non-magnetic conductor (e.g., ruthenium). Such a multi-layer pinned layer is generally referred to as anti-parallel (AP) pinned layer. The magnetization of the pinned layer 220 is generally, although not necessarily, is fixed (i.e., pinned) through exchange coupling with an antiferromagnetic (AFM) layer 225. The AFM layer 225, is generally made of NiMn, FeMn or NiO. The magnetization of the free layer, however, is free to rotate in response to an external field. Free layer 210, spacer layer 215, pinned layer 220 and the AFM layer 225 (if used), which are collectively referred to as MR material, are all formed in the central region 202 over the substrate 228. Hard bias (HB) layers 230 and 235 which are formed in the end regions 204 and 206, respectively, provide longitudinal bias for the MR free layer 210. Hard bias layers 230 and 235 are generally, although not necessarily, deposited over seed layers 280 and 285, respectively. Hard bias layers 230 and 235 form contiguous junctions 274 and 276, respectively, with at least the free layer 210. Leads 240 and 245 which are formed over the hard bias layers 230 and 235, respectively, provide electrical connections for the flow of the sensing current $I_s$ from the current source 260 to the MR sensor 200. The MR material further has first and second side edges 270 and 272 (FIG. 2B).

FIG. 3 shows a wafer 300 manufactured by Applicant's ion beam sputtering system for making SV sensors. FIG. 3 illustrates schematically the general pattern of several blocks 301, each block comprising a plurality of rows 302. Each of the rows 302 comprises a plurality of SV sensors (such as SV sensor 200 or 900) disposed along each row and formed on the wafer substrate 306.

As mentioned earlier, Applicant conducted an experiment in which the ion beam sputtering system 120 was used to build SV sensors 200 on the wafer substrate 306. In doing so, layers of sputtered material comprising the layer structure of the central region 202 of the SV sensor 200 were individually deposited on the whole wafer. Photoresist materials 290 and 291 were then deposited on the whole wafer, after which they were exposed to light in selected regions and developed to provide openings for removal of the deposited materials outside of the central region 202. FIG. 2B shows the step in the manufacturing process of the SV sensor 200 after photoresists 290 and 291 have been developed and the deposited materials outside of the central region 202 have been removed using ion-milling. Following the step shown in FIG. 2B, seed layer material, hard bias material and lead materials were sputtered deposited sequentially in the end regions 204 and 206. The materials deposited in the end regions 204 and 206 were sputtered deposited at near-normal (85 to 95 degree) angle as shown by arrows 292 (FIG. 2C).

Close examination of the SV sensor 200 (FIG. 2A) reveals the following shortcomings present in the SV sensor 200 formed according to the aforementioned steps:

(i) the thickness of the seed layers 280 and 285 are not uniform;

(ii) the thickness of the hard bias layers 230 and 235 are not uniform; hard bias layers 230 and 235 taper off by the first and second side edges 270 and 272, respectively; and a notch is formed in each of the hard bias layers 230 and 235 adjacent to the MR material side edges 270 and 272. Hard bias tapering results in low coercivity hard bias material deposited at the edges of the MR material resulting in MR sensor instability during the read operation; and (iii) the thickness of the lead layers 240 and 245 are not uniform and they taper off near the MR material side edges 270 and 272. Lead tapering results in loss of electrical signal.

Furthermore, Applicant conducted another experiment in which the ion beam sputtering system 120 was used to build SV sensors 200 on the utilized area of the wafer substrate 306 and the uniformity of the deposited layers across the entire utilized area of the wafer were measured by measuring the sheet resistance of each deposited layer at the five positions 305 indicated on a diameter of the wafer 300. The uniformity of the sheet resistance across the wafer is expressed as a percent uniformity which is a measure of the maximum variation in the film thickness that may be seen on a given wafer.

FIG. 4 is a graph showing the normalized sheet resistance of the Cu spacer film 215 of the SV sensor 200 measured at five positions 305 across the wafer 300. As shown in FIG. 4, the Cu film thickness varied by as much as 11.3% across the utilized area of the wafer 300. The NiFe and Co layer thicknesses, measured at the same five locations 305 across the wafer 300, varied by about 3.5% and 2.7%, respectively.

Eleven and Three Tenth percent (11.3%) variation in the thickness of the Cu spacer film across the wafer 300 means that many of the MR sensors on wafer 300 fail to work properly or have unacceptably large variations in their responses. Also, as the size of the wafer increases to improve productivity, the problem of achieving film uniformity across the wafer becomes even worse.

The prior art does not address or acknowledge the problems associated with:

(i) lack of seed layer, hard biasing layer and lead layer thickness uniformities in each MR sensor built in an ion beam sputter deposition system;

(ii) poor physical, electrical and magnetic properties at the contiguous junction between materials deposited adjacent to each other; and (iii) lack of thickness uniformity of thin layers deposited over the entire utilized area of the wafer in an ion beam deposition system.

Therefore, there is a need for an invention of a method and apparatus for controlling the properties and thickness of individual films of a multilayer thin film structure deposited adjacent to each other on a wafer substrate in an ion beam sputtering system.

There is a further need for an invention of a method and apparatus for controlling the thickness uniformity of individual films of a multilayer thin film structure deposited on a wafer substrate in an ion beam sputtering system.

There is also a further need for an invention disclosing a method and apparatus to control the thickness of individual layers of the multilayer structures of MR sensors deposited adjacent to each other on a wafer substrate in an ion beam sputtering system.

SUMMARY OF THE INVENTION

It is an object of the present invention to disclose an ion beam sputtering system having a substrate stage that can be made to tilt through a predefined angle.

It is a further object of the present invention to disclose an ion beam sputtering system having a substrate stage that can be made to tilt and form a non-normal angle with respect to its vertical axis, before or during the deposition process.

It is yet another object of the present invention to disclose an ion beam sputtering system having a substrate stage connected to a stage arm where the substrate stage can be made to tilt about the major axis (longitudinal axis) of the stage arm.

It is still another object of the present invention to disclose an ion beam sputtering system having a substrate stage connected to a stage arm where the substrate stage can tilt about the minor axis of the stage arm.

It is another object of the present invention to disclose an ion beam sputtering system having a substrate stage that can rotate while it is tilted.

It is a further object of the present invention to disclose an ion beam sputtering deposition process for building MR (AMR, GMR or SV) sensors with improved physical properties of each of the individual layers of the multilayer structures deposited on a wafer substrate.

It is yet another object of the present invention to disclose an ion beam sputtering system having a tiltable substrate stage and a movable flux regulator.

These and other objects of the present invention are accomplished by Applicant's invention of an ion beam sputter deposition system where a workpiece is securely placed on the top surface of the substrate stage during the ion beam sputtering deposition process. The substrate stage can be made to tilt and form a non-normal angle with respect to its vertical axis such that the workpiece also forms a non-normal angle with respect to the incoming deposition atoms. The substrate stage is further made to rotate about its vertical axis while it is also tilted with respect to its vertical axis. The tilting substrate stage allows controlling the physical properties of the films deposited by allowing the sputtered atoms (flux) to be deposited on the workpiece at a non-normal deposition angle (i.e., an angle which is different from 90 degree).

The ion beam sputter deposition system further includes a flux regulator located between the target and the workpiece which can be made to move, relative to the substrate, in each of the three orthogonal X, Y and Z Cartesian directions as well as rotation about its longitudinal axis and swinging in a plane of a predefined axis through a predefined angle. The position of the movable flux regulator relative to the workpiece affects the thickness uniformity of thin films deposited on and across the entire utilized area of the wafer. The best position of the movable flux regulator has been found, through experimentations, to be different for different materials deposited from different targets in the same ion beam system. Applicant's movable flux regulator refers to a flux regulator that its position, relative the workpiece, can be changed depending on the material being deposited.

Therefore, Applicant's ion beam sputtering system having a tiltable substrate stage allows sputtered flux deposition on the workpiece at a non-normal angle thus substantially improving the physical, electrical and magnetic properties of the contiguous junctions formed between the layers deposited adjacent to each other. Furthermore, Applicant's ion beam sputtering system having a movable flux regulator provides means for achieving uniform thickness for each layer deposited over the entire utilized area of a wafer.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 3:
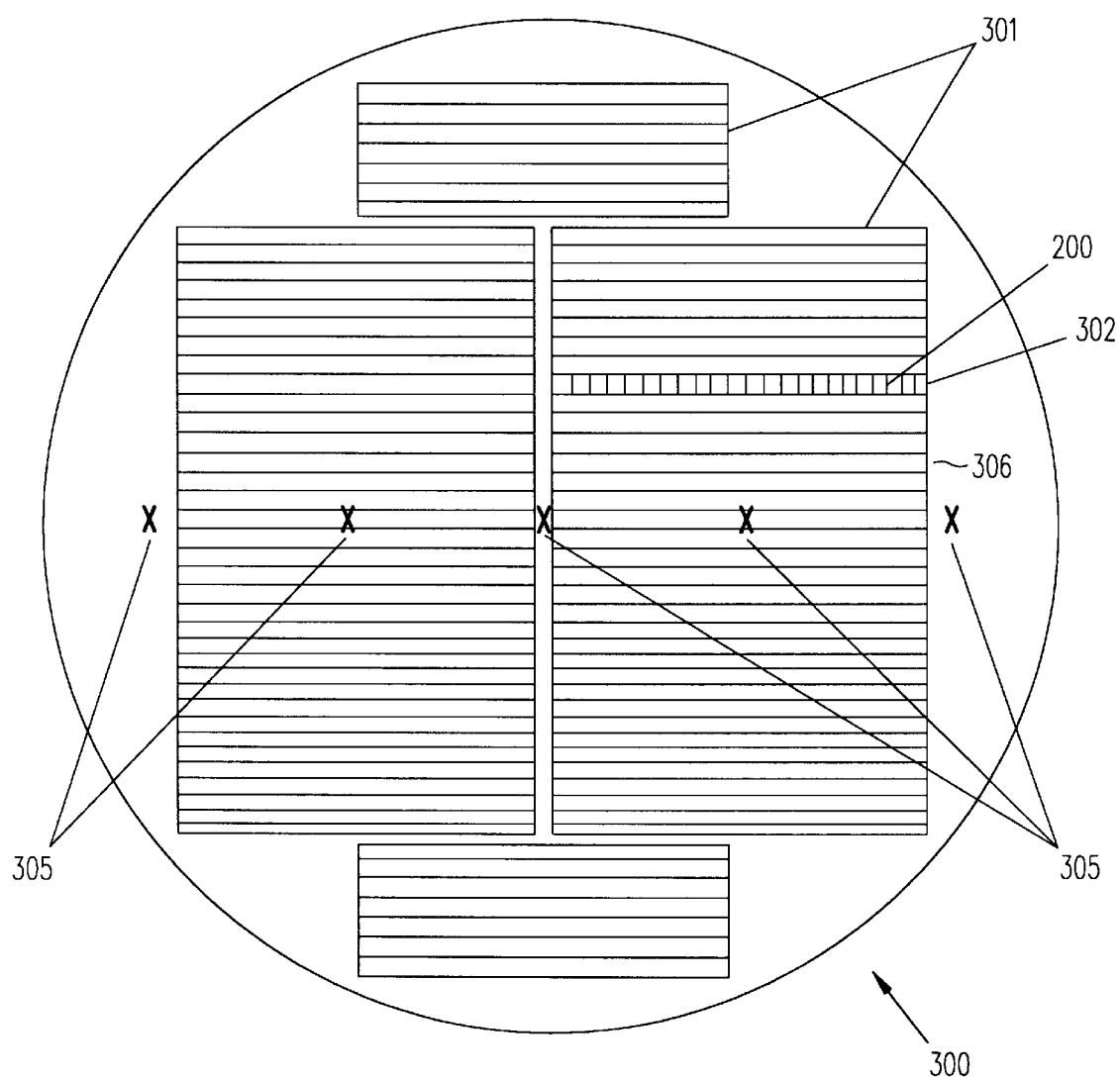
FIG. 3 is a plan view of a wafer showing the general pattern of SV sensors formed on the wafer in Applicant's ion beam sputter deposition systems.
Figure 4:
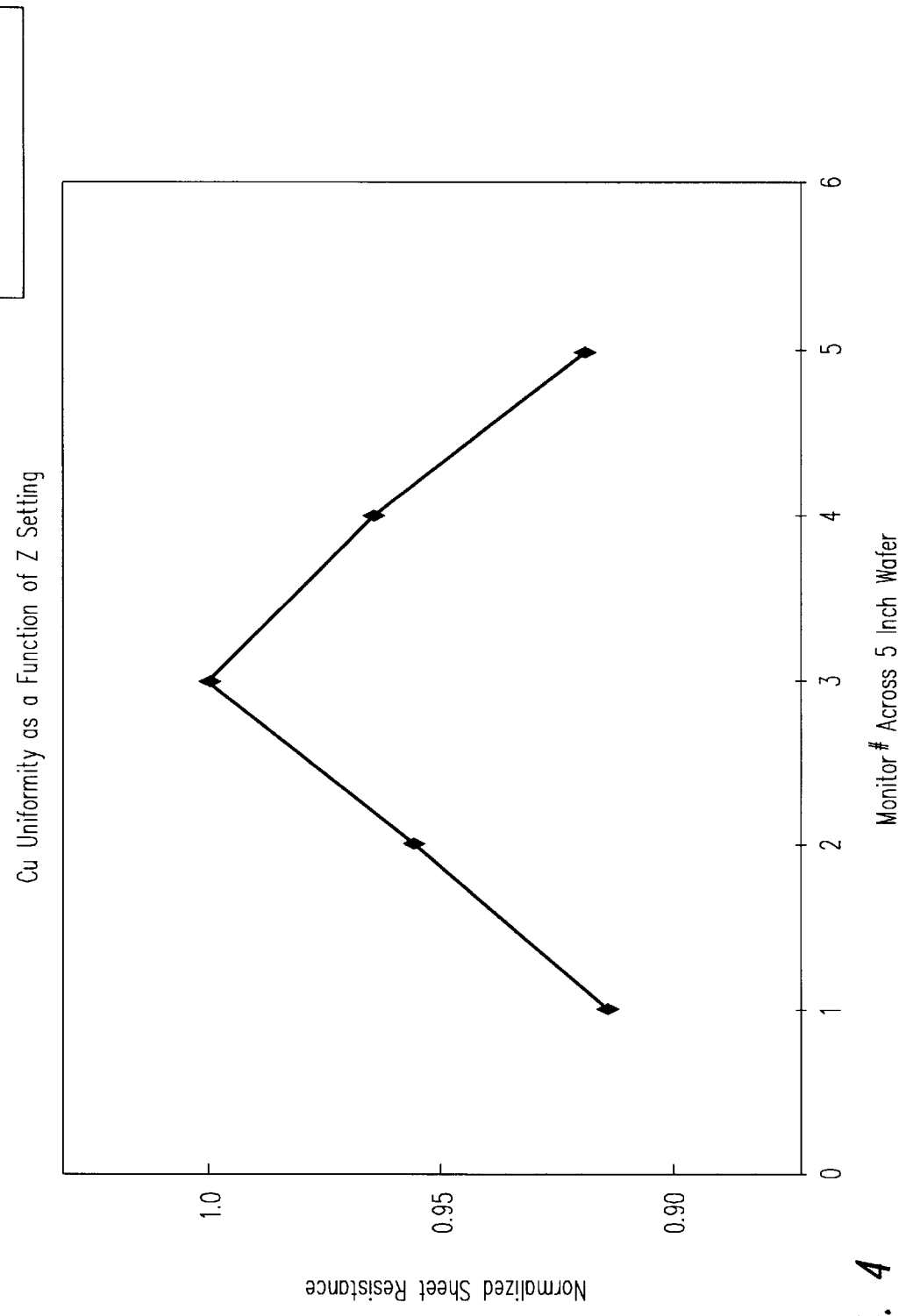
FIG. 4 is a graph showing the variation in sheet resistance of a copper layer across the wafer of FIG. 3 deposited using the ion beam sputtering system of FIG. 1.
Figure 5:
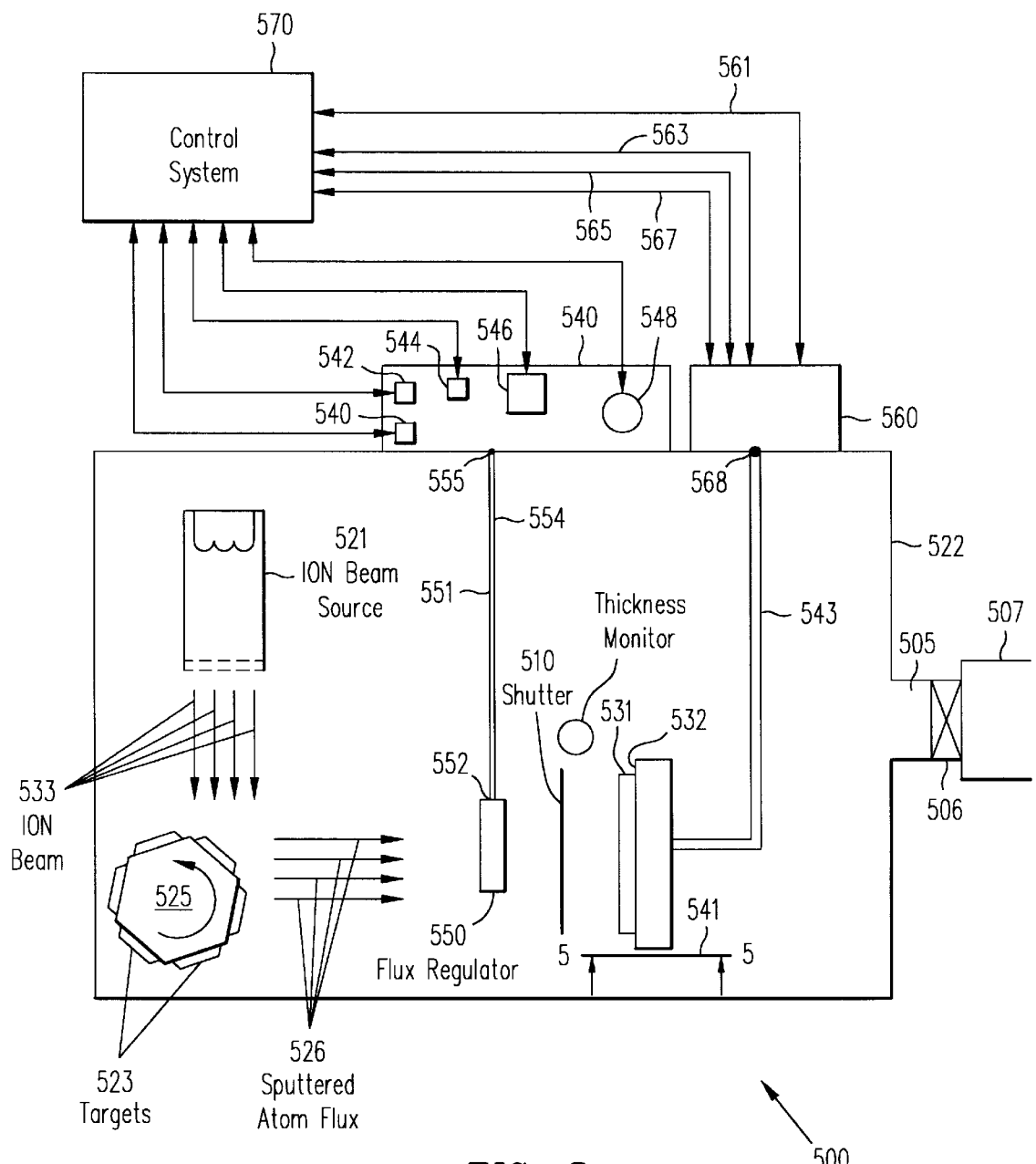
FIG. 5 is a block diagram of the preferred embodiment of the ion beam sputtering system of the present invention having a tilting substrate stage.

Referring now to FIGS. 5 through 8, there are shown several diagrams of the ion beam sputtering deposition system (ion beam system, IBS) 500 of the present invention. The ion beam system 500 comprises a vacuum chamber 522 exhausted to a suitable low pressure by a vacuum pump 507 via port 505 which can be closed by a gate valve 506. An ion beam source 521 directs energetic ions 533 at a selectable multiple targets 523 of one or more materials where the impacting ions cause sputtering of the selected target material. The sputtered atoms 526 emitted from the selected target material are then sputter deposited on a workpiece (wafer) 531. Workpiece 531 is a wafer similar to the wafer 300 shown in FIG. 3. The ion beam source 521 may be any suitable ion beam source such as a Kaufman source. The selectable multiple targets 523 is generally mounted on a rotary target support 525. Alternatively, a single target of material may be used instead of the selectable multiple targets 523.

The ion beam system 500 further includes a substrate stage 541 having a top surface 532, a longitudinal axis 537 lying in the plane of the top surface 532 and a vertical axis 535 which is perpendicular to the top surface 532. The substrate stage 541 is connected to a stage arm 543 via mechanical gears (not shown). The stage arm 543 which has a longitudinal axis 564 and a vertical axis 566, is in turn connected to a stage controller 560 via a connection point 568 which generally includes mechanical gears for controlling the stage arm 543 motions. Stage controller 560 is in turn connected and controlled by a control system 570. Workpiece 531 is securely mounted, via clamps (not shown) or through vacuum suction (not shown), on the substrate stage 541 such that the tilting and/or rotation of the substrate stage 541 causes the tilting and/or rotation of the workpiece 531. In the preferred embodiment of the present invention, substrate stage 541 can be made to tilt by rotating the stage arm 543 about its longitudinal (major) axis 564. As a result, substrate stage 541 tilts with respect to the vertical axis 535 such that the top surface 532 forms a non-normal angle with respect to the vertical axis 535. Consequently, top surface of the workpiece 531 forms a non-normal angle with respect to the sputtered atoms 526 emitted from the selected target material. In the preferred embodiment of the present invention, substrate stage 541, is preferably a circular stage which can also be made to rotate about the vertical axis 535, using a rotary/linear motor (not shown), during any deposition step in order to rotate the workpiece 531.

Communication buses 561, 563, 565 and 567, connecting the control system 570 to the stage controller 560, are utilized to transfer information between the control system 570 and the stage controller 560 such as whether substrate stage 541 should rotate or not, how fast it should rotate, whether substrate stage 541 should tilt, and in which direction it should tilt. Once the control system 570 issues commands to the stage controller 560 such as commands for rotating, rotation speed, tilting and/or moving upward or downward the substrate stage 541 and tilting direction during a film deposition process, stage controller 560 in turn controls the substrate stage 541 rotation, rotation speed, tilting and tilting direction via the stage arm 543. The stage arm 543 is connected to the stage controller 560 via the connection point 568 such that the stage arm 543 can be made to tilt, rotate and pivot in all directions (X-direction, Y-direction, Z-direction, XY-plane, XZ-plane, and YZ-plane) about the connection point 568. In the preferred embodiment of the present invention, substrate stage 541 is made to tilt by rotating the stage arm 543 about its longitudinal axis 564 (FIGS. 8A–8A', 8B–8B', and 8C–8C'). Alternatively, the substrate stage 541 may be made to tilt by moving the stage arm 543 up or down about the connection point 568 (FIGS. 7A–7B) such that the stage arm 543 forms a non-normal angle with the vertical axis 566.

Figure 6A:
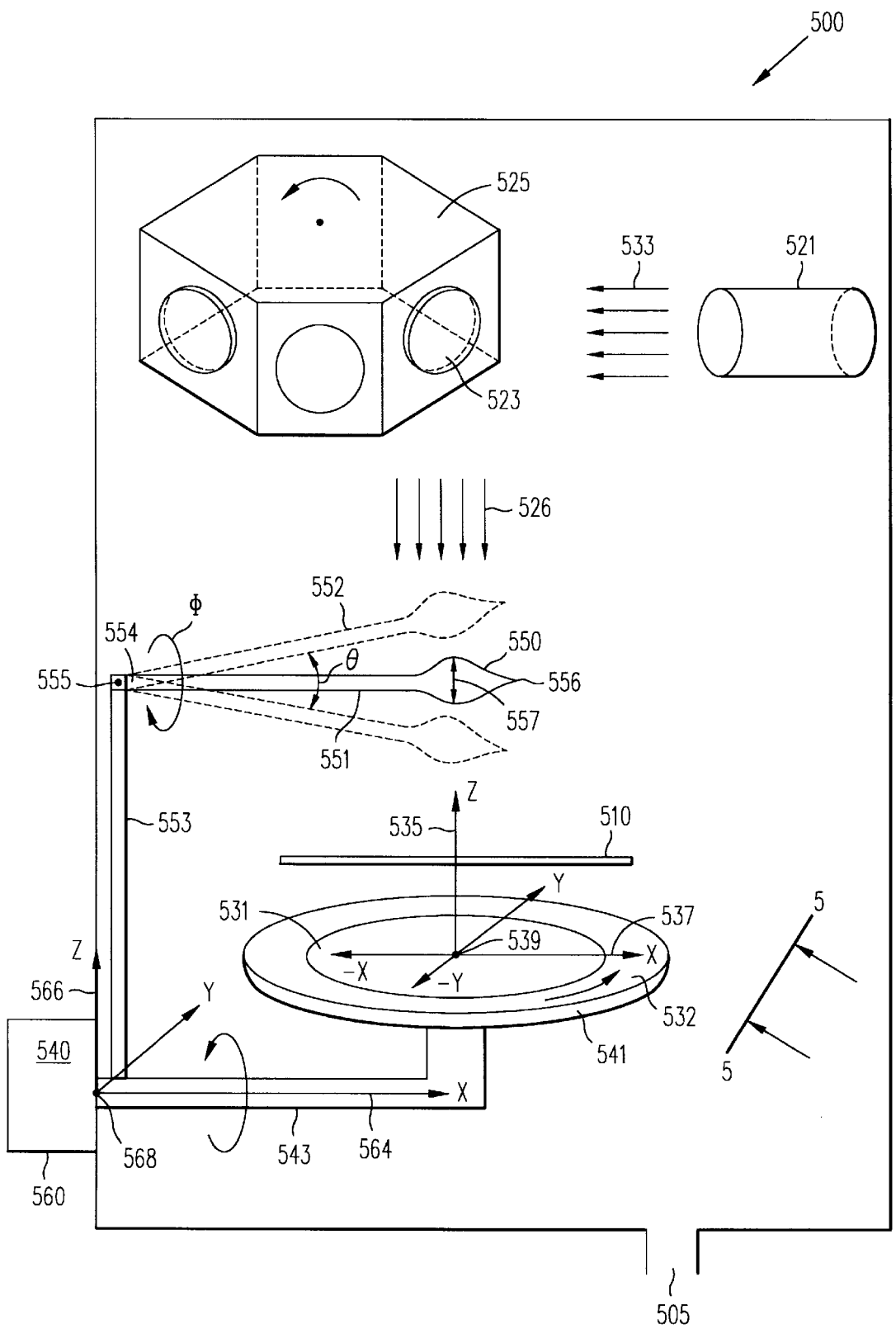
FIG. 6A is a drawing, not to scale, showing the substrate stage of the present invention in relation to the movable flux regulator positioned between the target and substrate in the ion beam sputtering system of the present invention.
Figure 6B:
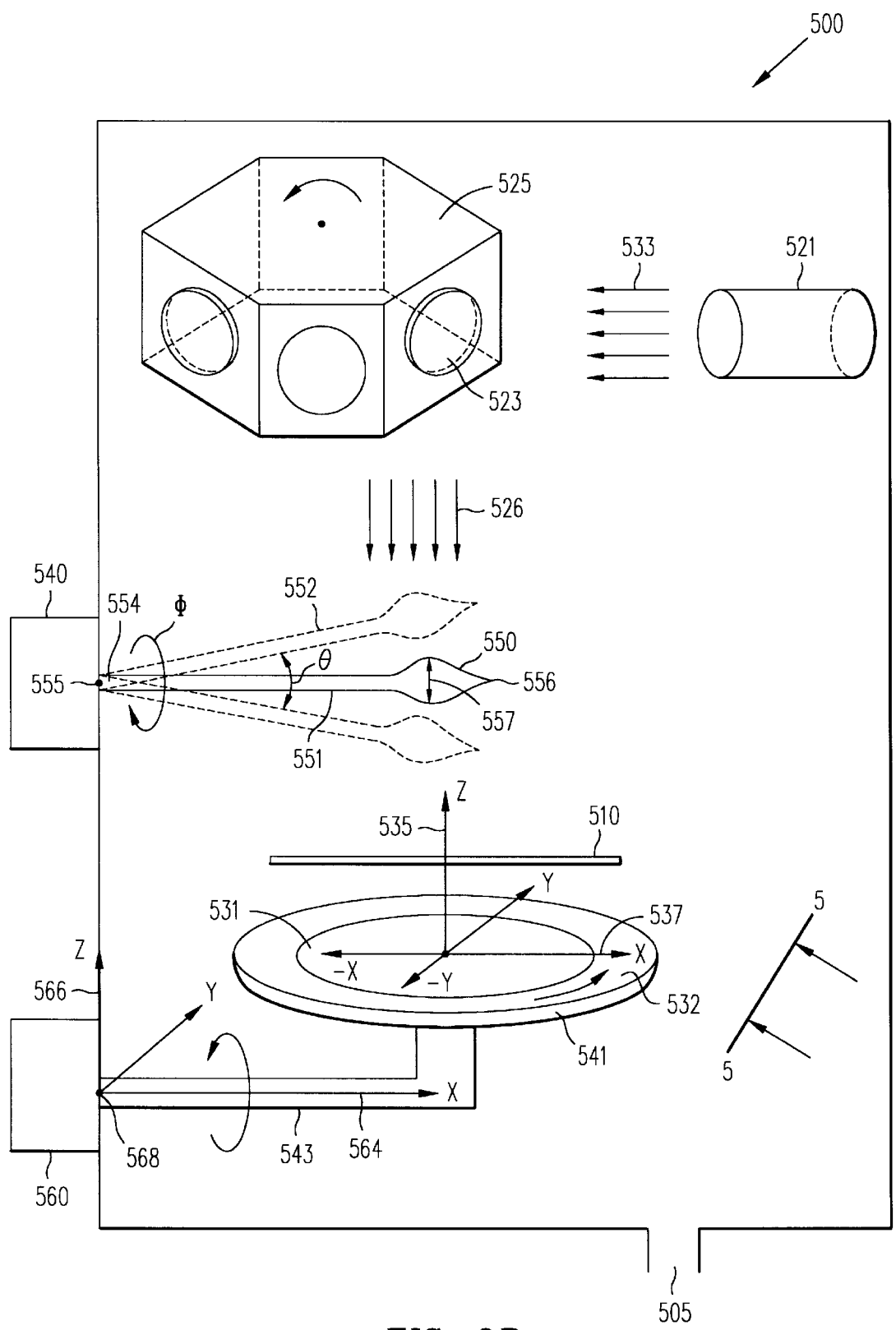
FIG. 6B is an alternative embodiment of the invention shown in FIG. 6A.

The ion beam system 500 further comprises a movable flux regulator 550 connected to a flux regulator shaft 551. Flux regulator shaft 551 has a first end 552 and a second end 554. In the preferred embodiment of the present invention, flux regulator shaft 551 movement is made totally independent of the stage arm 543 movement by connecting the second end 554 of the shaft 551 directly to a flux regulator controller 540 (FIGS. 5 and 6B) mounted on the wall of the chamber 522. Alternatively, the second end 554 of the flux regulator shaft 551 may be connected to a flux regulator arm 553 where the flux regulator arm 553 is in turn connected to the stage arm 543 as shown in FIG. 6A. Flux regulator 550 is positioned between the target 523 and the workpiece 531 so as to partially block the sputtered atom flux 526 from colliding with the workpiece 531 and thus modifying the flux distribution deposited on the whole workpiece 531. Flux regulator 550 proper operation depends on the continuous rotation of the workpiece 531 about the vertical axis 535, during each deposition step, in order to average the incident sputtered atom flux. Because the incident sputtered atom flux is generally highest at the center of the substrate, the preferred shape of the movable flux regulator 550 is an arrowhead-like shape whose width increases gradually from the tip 556 to a maximum width 557 (about 2.5 cm) and then gradually decreases (tapering off) to the width of the flux regulator shaft 551. The length of the flux regulator 550 from its tip 556 to the first end 552 of the flux regulator shaft 551 is about 5 cm. Arrowhead-shape of the flux regulator 550 results in greater blockage of the atom flux at the inner radii of the workpiece 531 than at the outer radii. The flux regulator 550 is movable relative to the workpiece 531 by moving the flux regulator shaft 551 which can move about the connection point 555 (FIGS. 6A–6B). In the case of the embodiment shown in FIG. 6A, the flux regulator 550 may also be made to move by moving the flux regulator arm 553. The flux regulator controller 540 is generally fitted with three orthogonal linear drive systems; an X-direction drive 540, a Y-direction drive 542, a Z-direction drive 544, a fourth drive system 546 for swinging the flux regulator 550 in the plane of a predefined axis through angle $\Theta$ (less than 180 degree) (FIG. 6A), and a fifth drive system 548 for rotating the flux regulator about its longitudinal axis through angle $\phi$ (less than 180 degree) (FIG. 6A). The flux regulator controller 540 is controlled by the control system 570 to move (via rotary/linear motors) the flux regulator 550 to a predetermined position during ion beam sputter deposition of a target material on the workpiece 131. In the preferred embodiment of the present invention, the position of the movable flux regulator 550 in the X-direction, Y-direction and Z-direction is adjusted for each target material to be sputter deposited on the workpiece 131. A movable shutter 510 is also located between the flux regulator 550 and the workpiece 531 to block the incidence of atoms ejected from the target so that atoms reach the workpiece 531 only during the deposition steps.

Figure 7A:
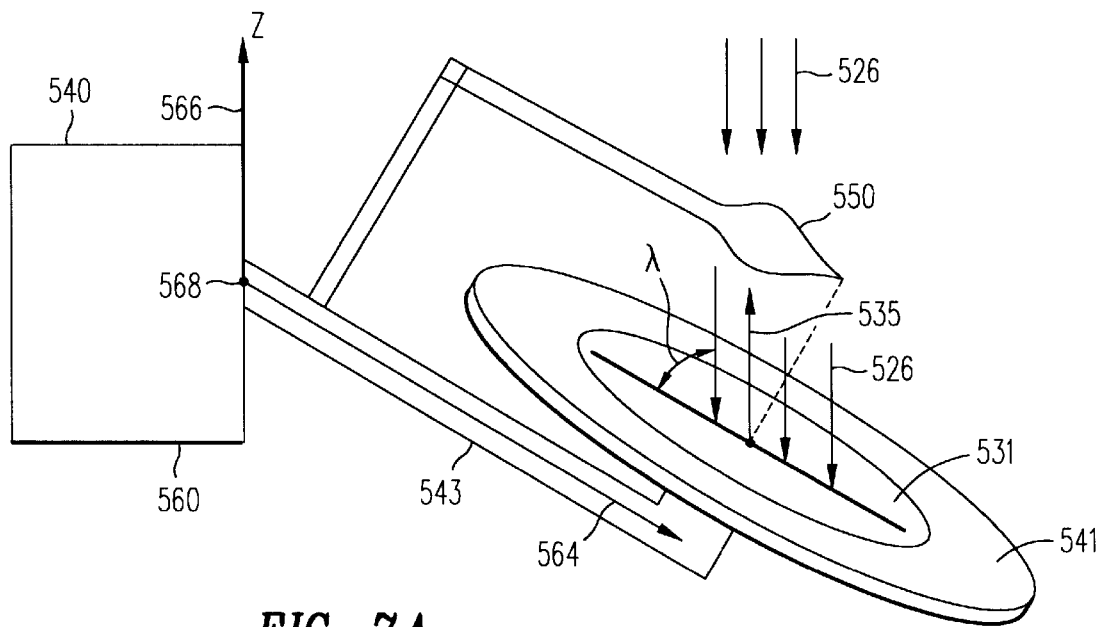
FIGS. 7A and 7B are drawings, not to scale, showing the tiltable substrate stage of the present invention tilting about its vertical axis downward and upward, respectively.
Figure 7B:
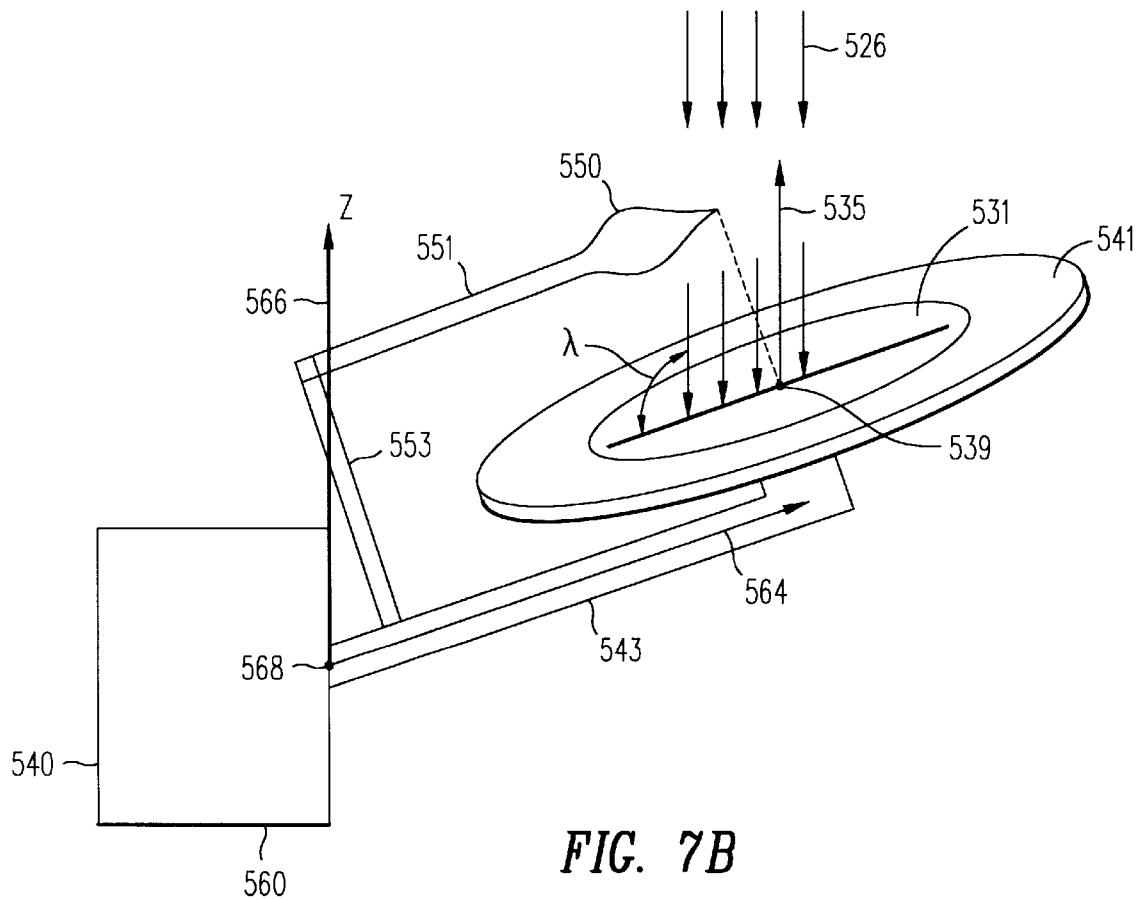
Figure 8A:
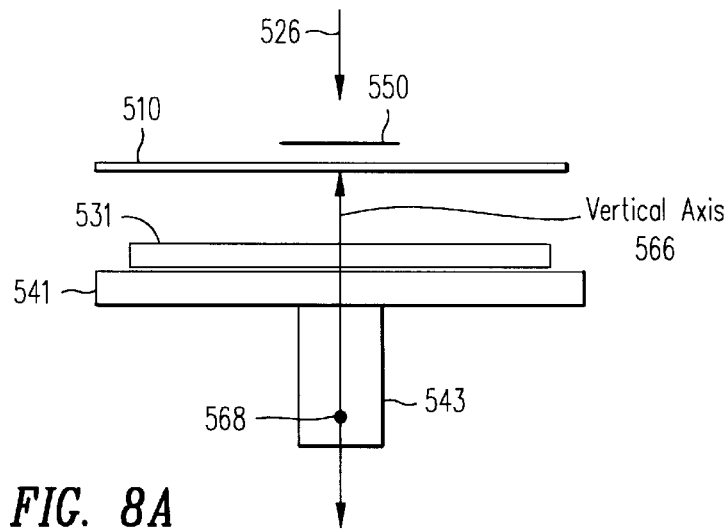
FIGS. 8A and 8A' are frontal and side (as seen in plane 5—5) views, respectively, of the substrate stage of the present invention without tilting.

Referring to FIGS. 6A and 7A–B, it should be noted that in this embodiment when the substrate stage 541 is moved upward or downward, the distance between the substrate stage 541 and the flux regulator 550 remains constant since the flux regulator arm 553 is securely connected to the stage arm 543. However, referring to FIG. 6B, in contrast, when the substrate stage 541 is moved upward or downward, the distance between the substrate stage 541 and the flux regulator 550 decreases or increases, respectively since the movement of the stage arm 543 is independent of the movement of the flux regulator shaft 551. Tilting the substrate stage 541 during the sputtering deposition process causes the atoms of the selected target material to hit the workpiece 531 at a non-normal angle thus improving the thickness uniformity as well as electrical, physical and magnetic properties of the contiguous junction formed between the materials deposited adjacent to each other on the workpiece 531.

Now, referring to FIGS. 9A–9F, there is shown several steps in manufacturing a plurality of SV sensors 900 on a workpiece (substrate) 931 (similar to the wafer 300 shown in FIG. 3 and the wafer 531 shown in FIG. 5) using ion beam sputtering system 500 of the present invention having the tiltable and rotatable substrate stage 541. In the preferred embodiment of the present invention as described below, workpiece 931 is rotating during all sputter deposition steps.

Figure 1:
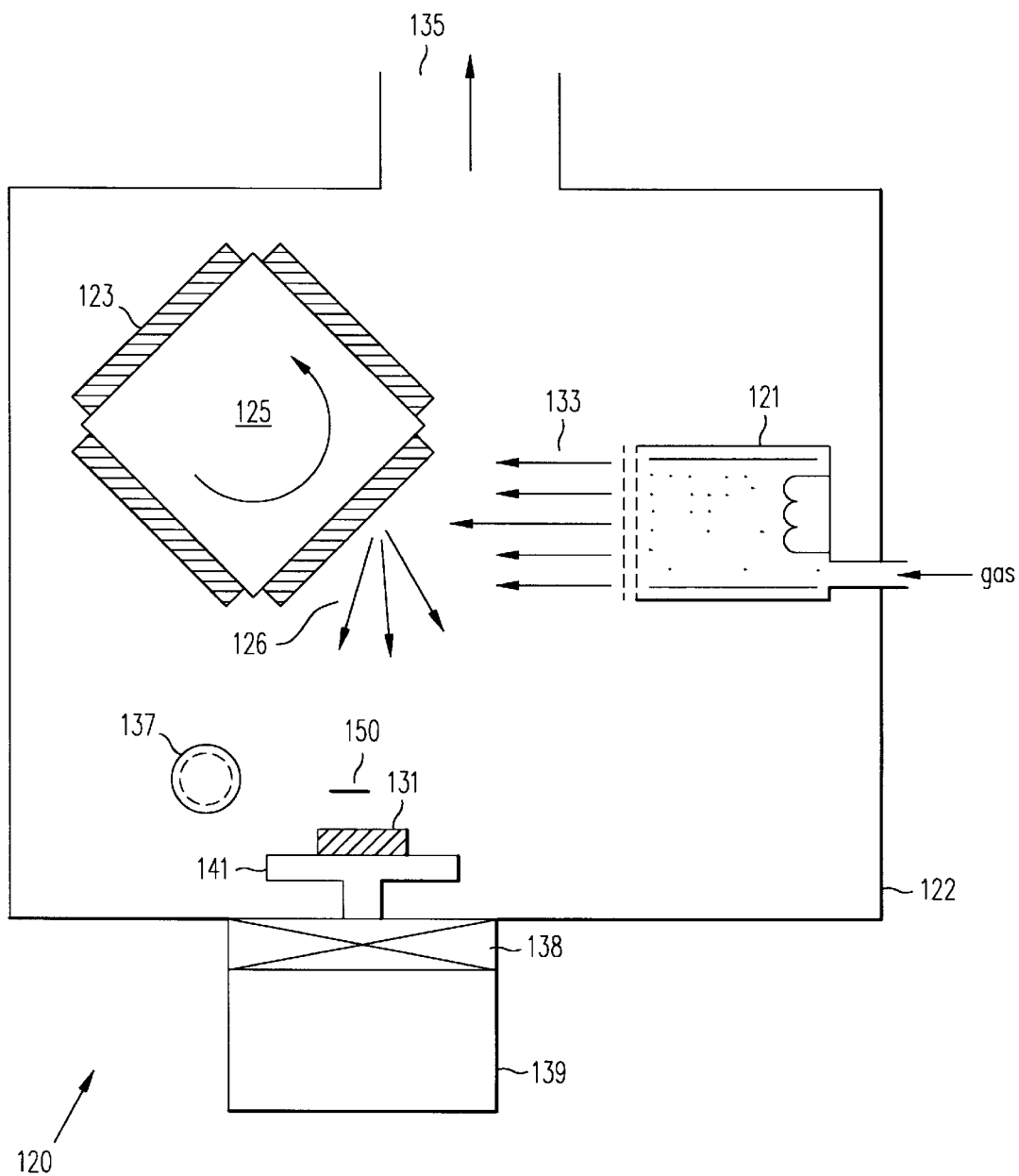
FIG. 1 is a block diagram of an ion beam sputtering deposition system.
Figure 2A:
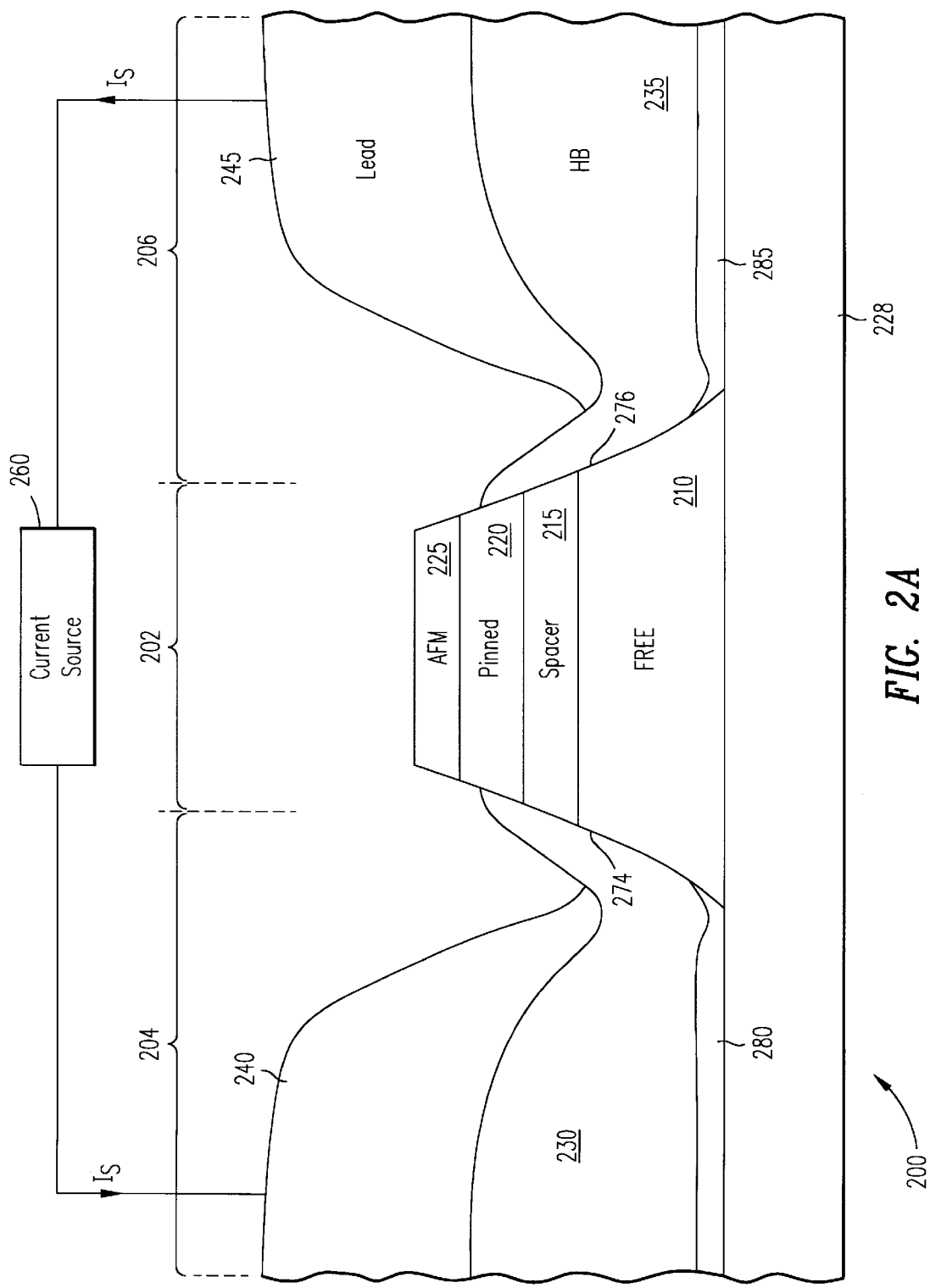
FIG. 2A is an air-bearing surface view, not to scale, of a SV sensor connected to a current source.
Figure 2B:
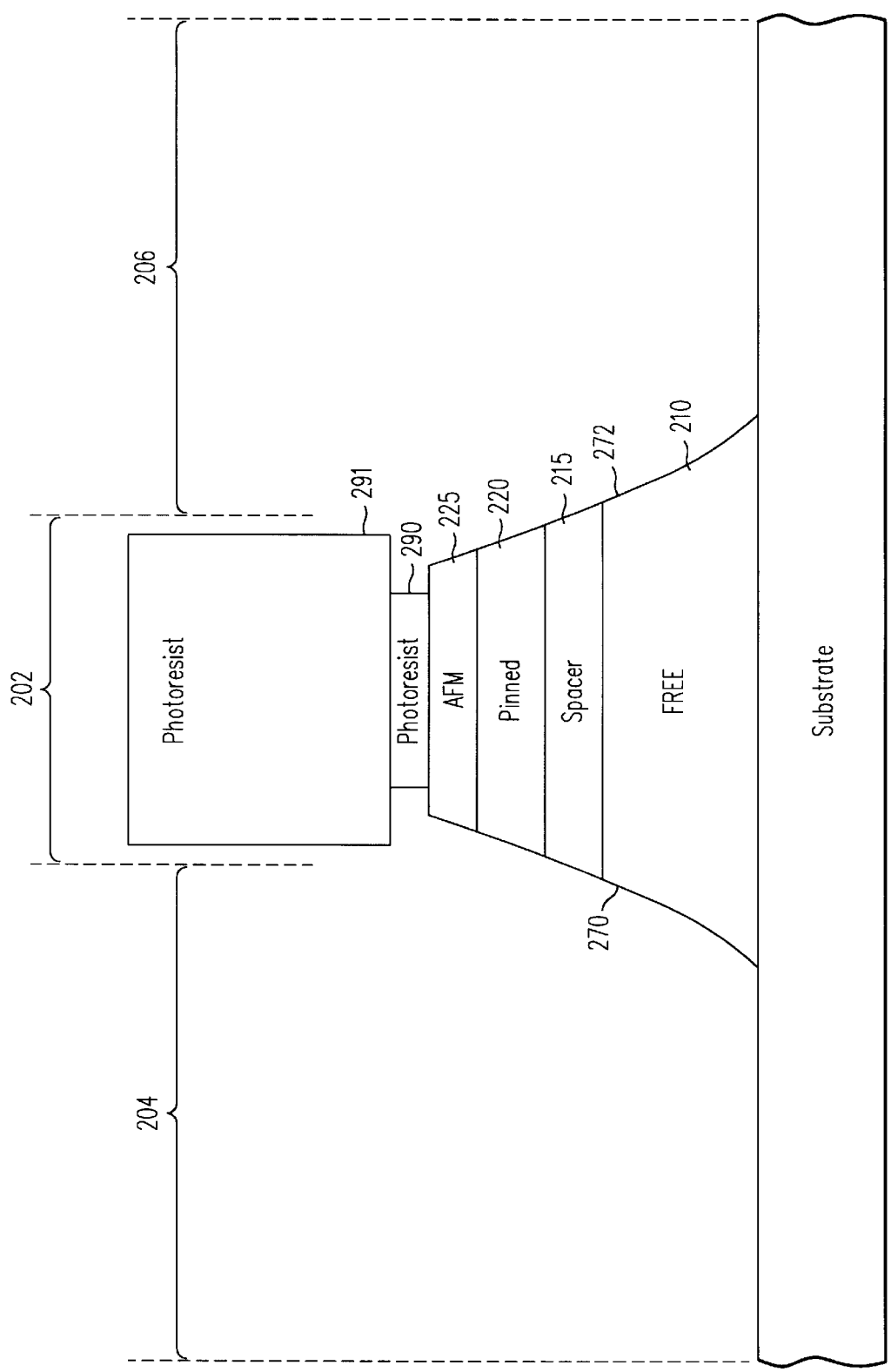
FIG. 2B is an air-bearing surface illustration, not to scale, of a step in making the SV sensor of FIG. 2A.
Figure 2C:
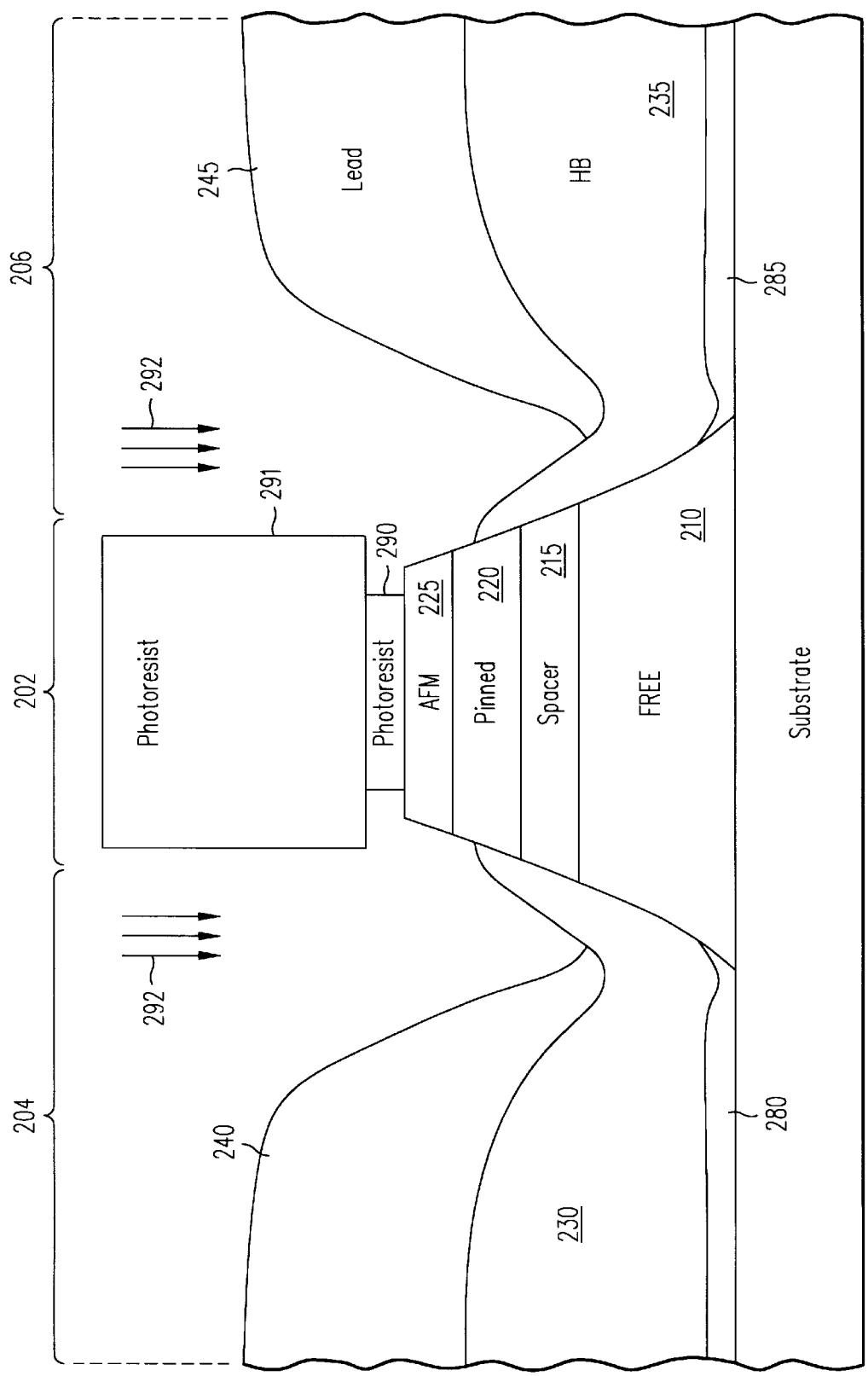
FIG. 2C is an air-bearing surface illustration, not to scale, of another step in making the SV sensor of FIG. 2A.
Figure 9A:
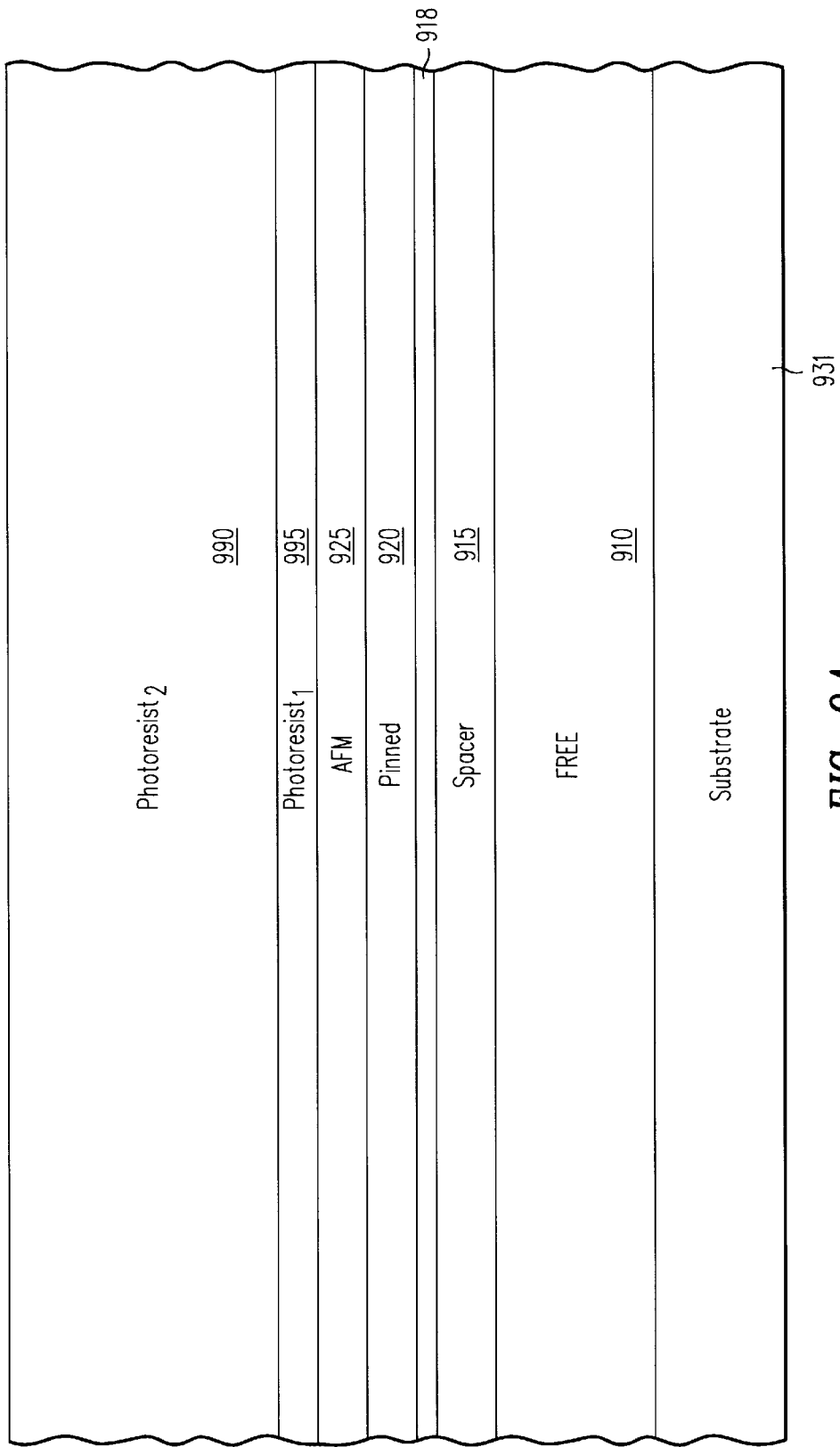
FIG. 9A is an ABS illustration, not to scale, of the photoresist deposition step in manufacturing the MR sensor 900 in the ion beam sputtering system of the present invention having a tiltable substrate stage.

FIG. 9A is an ABS illustration showing a step after photoresists 995 (photoresist1) and 990 (photoresist2) have been sequentially deposited over SV materials which is used to build a plurality of SV sensors 900. Although, many SV sensors 900 are built simultaneously on the substrate 931 in the ion beam system of the present invention, the remaining description is limited to only one such SV sensor. As can be seen, free layer 910 (typically made of NiFe or NiFe/Co), is first deposited over the entire utilized area of the substrate 931 followed by sequential deposition of a non-magnetic spacer layer 915 (typically made of Cu, Ag or Au), a pinned layer 920 (typically made of ferromagnetic (FM) material such as NiFe) which further includes a sub-layer 918 (typically made of Co), and an antiferromagnetic (AFM) layer 925 (typically made of Nio, FeMn or NiMn). Each layer is deposited with shape regulator 550 at a predetermined x position while the position of the shape regulator in y and z directions are fixed. The reference point for the purpose of positioning the shape regulator 550 is the center 539 (x=y=z=0) of the substrate stage 541. Table I shows uniformity data for several ion beam sputtered materials of the SV sensors 900 on a five inch diameter wafer using: (1) ion beam system of FIG. 1 having a non-movable flux regulator (fixed X-axis, Y-axis, and Z-axis positions for all the deposition steps); and (2) the ion beam sputtering system of the present invention having a movable flux regulator where the position of the movable flux regulator in Y and Z directions were fixed and its X-axis position was optimized for each individual layer deposited. The improved uniformity, especially of the critical Cu spacer layer 915, achieved over the entire utilized area of the wafer results in manufacturing SV sensors that have remarkably similar properties.

TABLE I

Uniformity of Deposited Layers

| | Material | X-Setting (mm) | Uniformity (%) |
| --- | --- | --- | --- |
| Non-Movable Flux Regulator | NiFe | +1.0 | 3.5 |
| | Co | +1.0 | 2.7 |
| | Cu | +1.0 | 11.3 |
| Movable Flux Regulator | NiFe | +1.5 | 1.2 |
| | Co | +1.0 | 2.7 |
| | Cu | −1.0 | 3.7 |

Figure 9B:
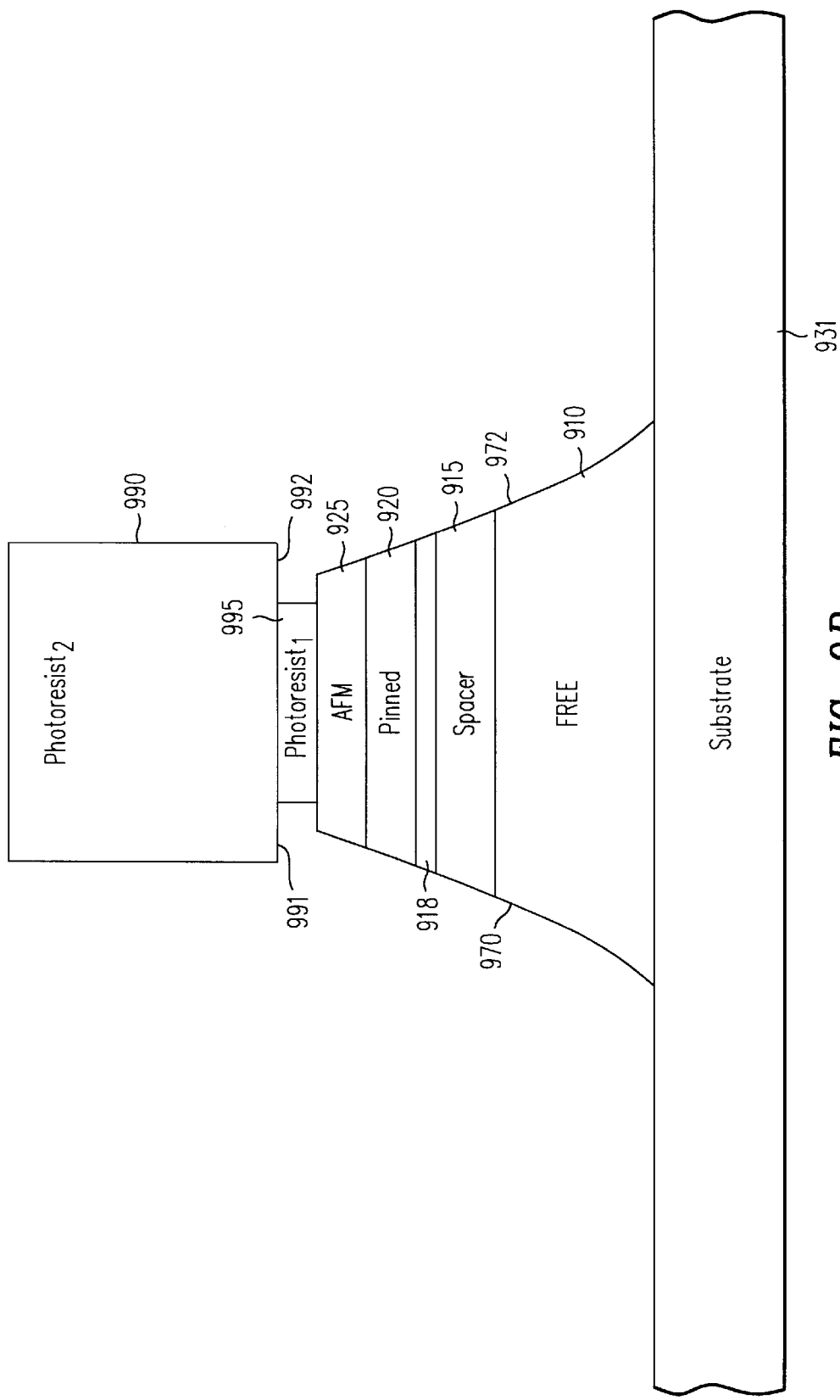
FIG. 9B is an ABS illustration, not to scale, of the photoresist development step in manufacturing the MR sensor 900 in the ion beam sputtering system of the present invention.

FIG. 9B is an ABS illustration showing a step in the manufacturing of the SV sensor 900 using the ion beam system 500 of the present invention after the development of the photoresist 990 and ion-milling of the SV materials. Note that ion-milling of the deposited SV materials results in sloped side edges 970 and 972.

Figure 8B:
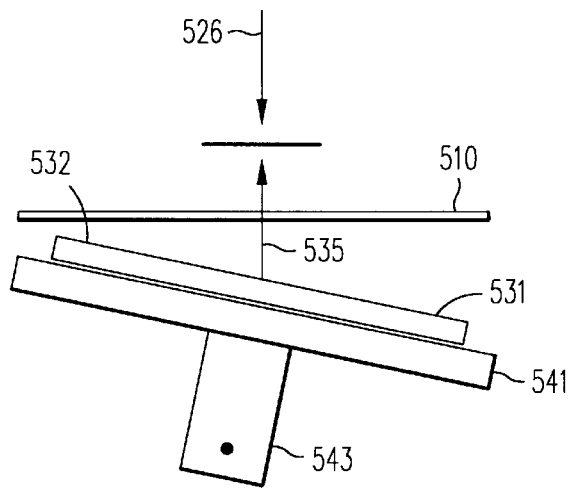
FIGS. 8B and 8B' are frontal and side views, respectively, of the substrate stage of the present invention tilting about its longitudinal axis in a first direction.
Figure 8C:
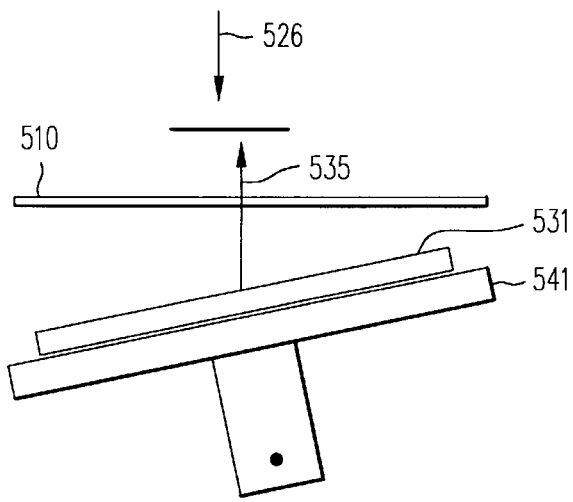
FIGS. 8C and 8C' are frontal and side views, respectively, of the substrate stage of the present invention tilting about its longitudinal axis in a second direction.
Figure 8A:
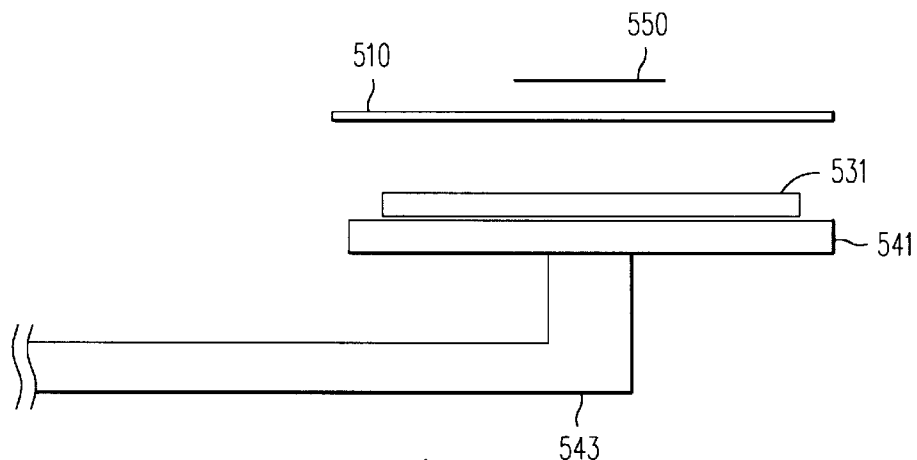
Figure 8B:
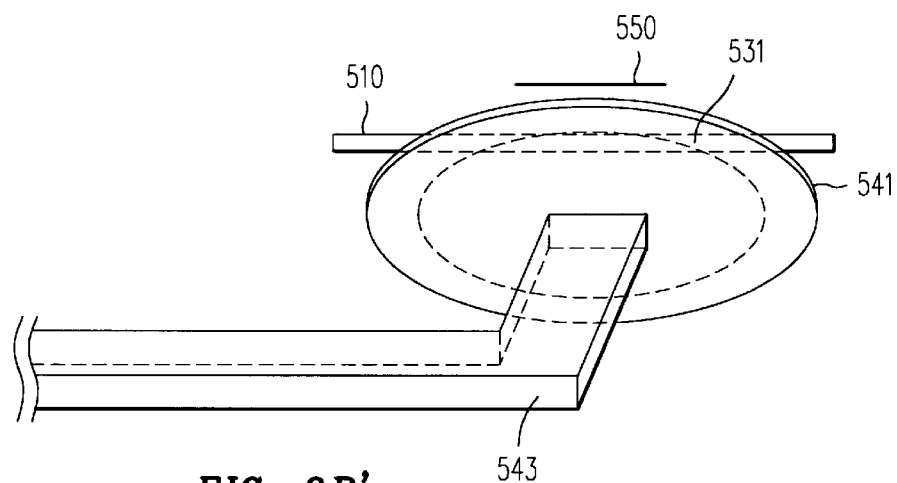
Figure 8C:
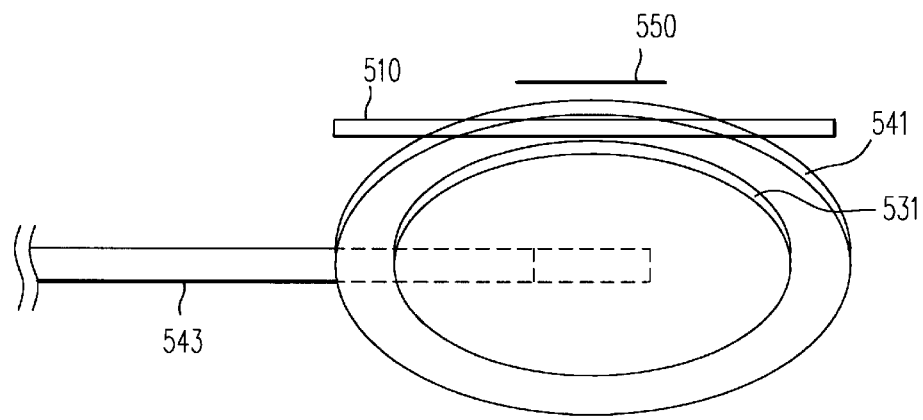
Figure 9C:
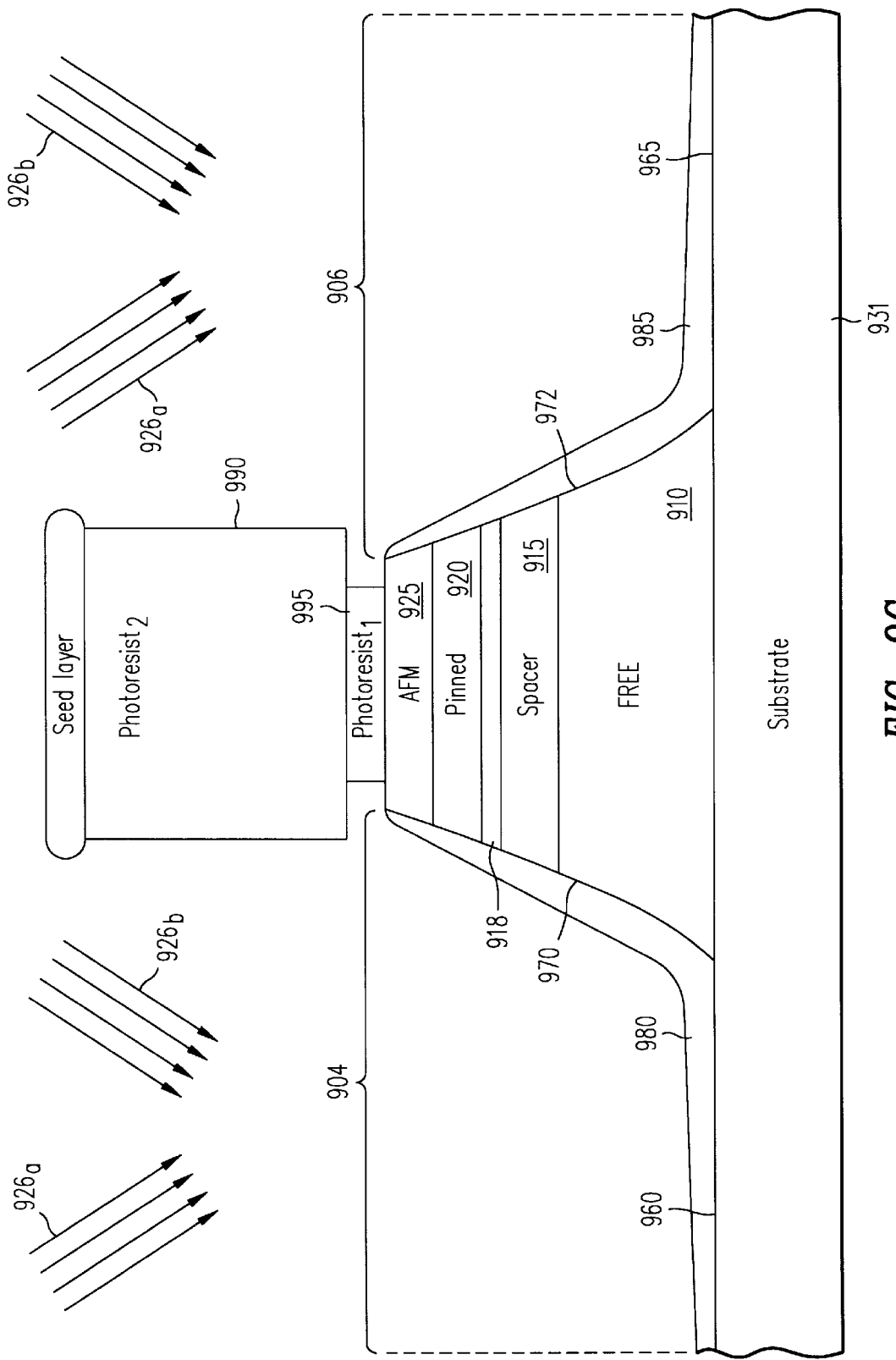
FIG. 9C is an ABS illustration, not to scale, of the seed material deposition step in manufacturing the MR sensor 900 in the ion beam sputtering system of the present invention.

FIG. 9C is an ABS illustration showing a step in the manufacturing of the SV sensor 900 using the ion beam system of the present invention after the deposition of the seed layers 980 and 985 in the end regions 904 and 906, respectively, as well seed layer material deposition over photoresist 990. In the preferred embodiment of the present invention, seed layers 980 and 985 are deposited by tilting the substrate stage 541 (and therefore tilting the substrate 931) by a predetermined amount as shown in either FIG. 8B or FIG. 8C.

The aforementioned tilting step, as shown in FIG. 8B or FIG. 8C, results in sputtered atom flux $926_a$ or $926_b$ hitting the workpiece 931 at non-normal angles resulting in the formation of the seed layers 980 and 985 on the side edges 970 and 972, as well as on the exposed portions 960 and 965 of the top surface of the substrate 931. The seed layers formed on the side edges 970 and 972 and the exposed portion 960 and 965 of the substrate 931 are substantially uniform in their thicknesses due to the fact that the substrate stage 541 was tilted and rotating during the deposition of the seed layer material. It should be noted that when the substrate stage 541 is tilted, the substrate 931 is also tilted since it is securely connected to the substrate stage 541 via, for example, clamps or vacuum suction.

Note that seed layers 980 and 985 may be deposited in a single step where the substrate stage 541 is either moved upward or downward (FIGS. 7A–B), where the substrate stage 541 is tilted about its longitudinal axis 537 (FIG. 6A) as shown in FIGS. 8A–8C, or where the substrate stage 541 is moved upward or downward and at the same time tilted by a predetermined angle about its longitudinal axis. In the preferred embodiment of the present invention substrate stage 541 motions (moving up or down, tilting about its longitudinal axis, and the combination of the aforementioned motions is controlled by moving the stage arm 543 about the connection point 568 using necessary mechanical gears as is well known in the art.

Figure 9D:
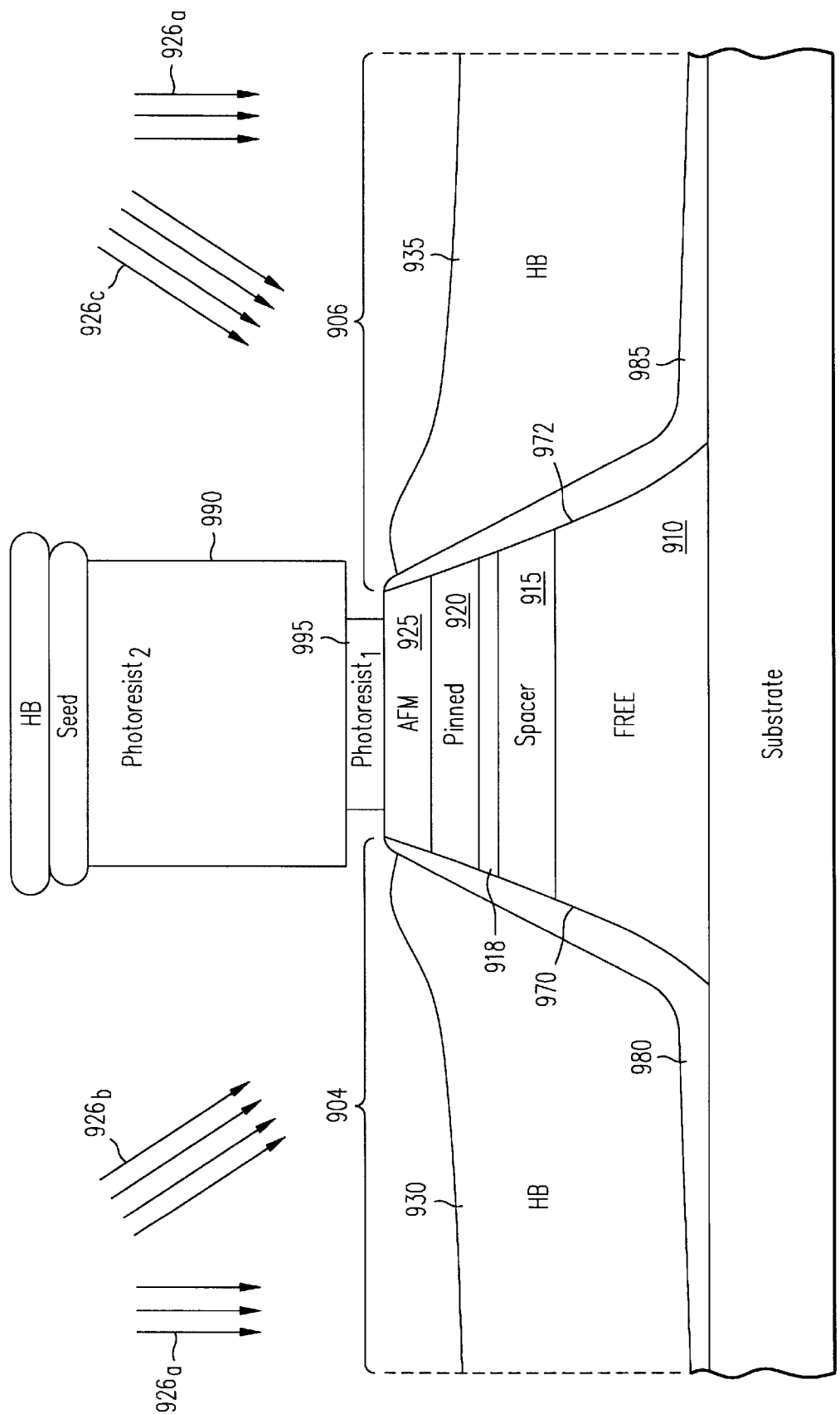
FIG. 9D is an ABS illustration, not to scale, of the hard biased material deposition step in manufacturing the MR sensor 900 in the ion beam sputtering system of the present invention.

FIG. 9D is an ABS illustration showing a step in the manufacturing of the SV sensor 900 using the ion beam system 500 of the present invention after the deposition of layers 930 and 935 of hard bias (HB) material over the seed layers 980 and 985 in the end regions 904 and 906, respectively, as well as hard bias material deposition over photoresist 990. Hard bias layers 930 and 935 are first partially deposited by sputtering hard bias atoms (sputtered atom flux $926_a$) at a normal angle on the workpiece. Next, the substrate stage 541 is tilted in a first direction by a predetermined angle (FIGS. 8A or 8B) and additional hard bias material (sputtered atom flux $926_b$) is deposited at the end regions 904 and 906 followed by tilting the substrate stage 541 in a second direction by a predetermined angle (FIGS. 8A or 8B) for depositing additional hard bias material (sputtered atom flux $926_c$) at the end regions 904 and 906. As a result of tilting the substrate stage 541 during the bias material deposition step, the resulting hard bias layers 930 and 935 are uniformly thick and do not have a notch near the side edges 970 and 972. Alternatively, the step of depositing hard bias material in the end regions 904 and 906 may be carried out in a single step of tilting the substrate stage 541 in a predetermined direction by a predetermined angle and then sputter depositing hard bias material in the end regions 904 and 906.

Figure 9E:
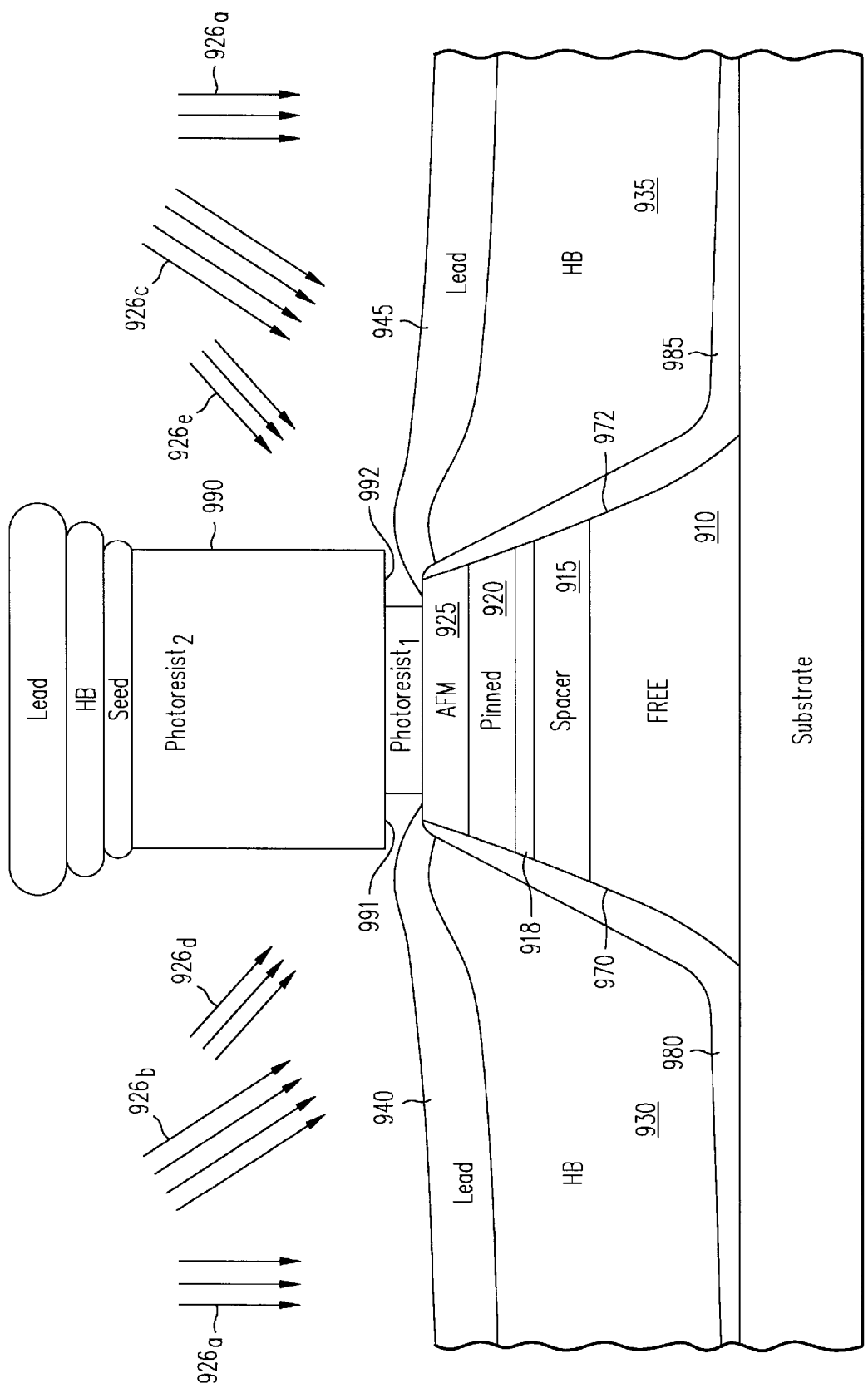
FIG. 9E is an ABS illustration, not to scale, of the lead material deposition step in manufacturing the MR sensor 900 in the ion beam sputtering system of the present invention.

FIG. 9E is an ABS illustration showing a step in the manufacturing of the SV sensor 900 using the ion beam system 500 of the present invention after the deposition of lead layers 940 and 945 in the end regions 904 and 906, respectively, as well as lead layer material deposition over the photoresist 990. Lead layers 940 and 945 may be deposited in several steps by tilting the substrate stage 541 several times, each time at a different angle. As shown in FIG. 9E, lead layers 940 and 945 are deposited through five partial depositions of sputtered atoms in the end regions 904 and 906. The partial depositions are carried out by first depositing sputtered atoms at normal angle ($926_a$), followed by depositing atoms at a first non-normal angle ($926_b$) followed by depositing atoms at a second non-normal angle ($926_c$), followed by depositing sputtered atoms at a third non-normal angle ($926_d$), followed by depositing sputtered atoms at a fourth non-normal angle ($926_e$). Non-normal angles $926_a$, $926_b$, $926_c$ and $926_d$ are due to sequentially tilting the stage substrate 541 in four different predetermined directions by predetermined angles. The aforementioned steps result in lead layers 940 and 945 which are uniformly thick, do not have a notch near the side edges 970 and 972, make contacts to the AFM layer 925 and can partially fill the space created by undercuts 991 and 992 in the photoresist 995. Alternatively, the step of depositing lead layer material in the end regions 904 and 906 may be carried out in a single step of tilting the substrate stage 541 in a predetermined direction by a predetermined angle and then sputter depositing lead layer material in the end regions 904 and 906.

Figure 9F:
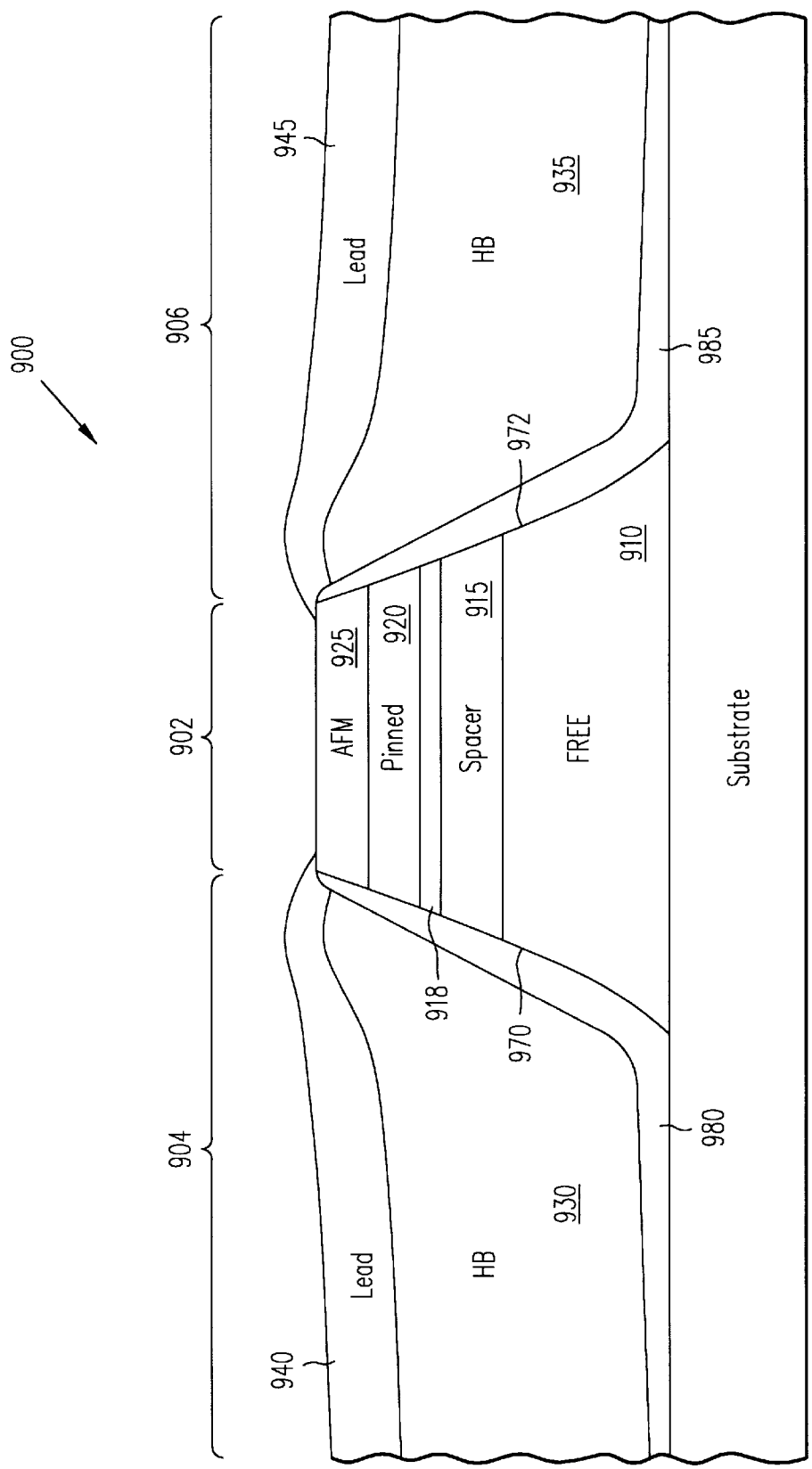
FIG. 9F is an ABS view of the MR sensor 900 manufactured using the ion beam sputtering system of the present invention having a tiltable substrate stage.

FIG. 9F is an ABS view of a complete SV sensor 900 manufactured using the ion beam system of the present invention after photoresist 990 and 995 have been removed. Comparing SV sensor 900 manufactured with Applicant's ion beam system 500 having a tiltable and rotatable substrate stage 541 with the SV sensor 200 manufactured with the ion beam system 120 having a non-tiltable substrate stage, it can readily be seen that all the disadvantages and shortcomings of the SV sensor 200 is virtually absent from SV sensor 900. That is, ion beam system 500 having a tiltable substrate stage provides the necessary tool:

(i) to improve the uniformity of the material deposited adjacent to the materials already deposited;

(ii) to improve the electrical and magnetic properties of the contiguous junction formed between the materials deposited adjacent to each other; and (iii) to eliminate any notching in the biasing layer which induces discontinuity between hard bias material and the sensor material resulting in MR sensor instability.

Figure 10:
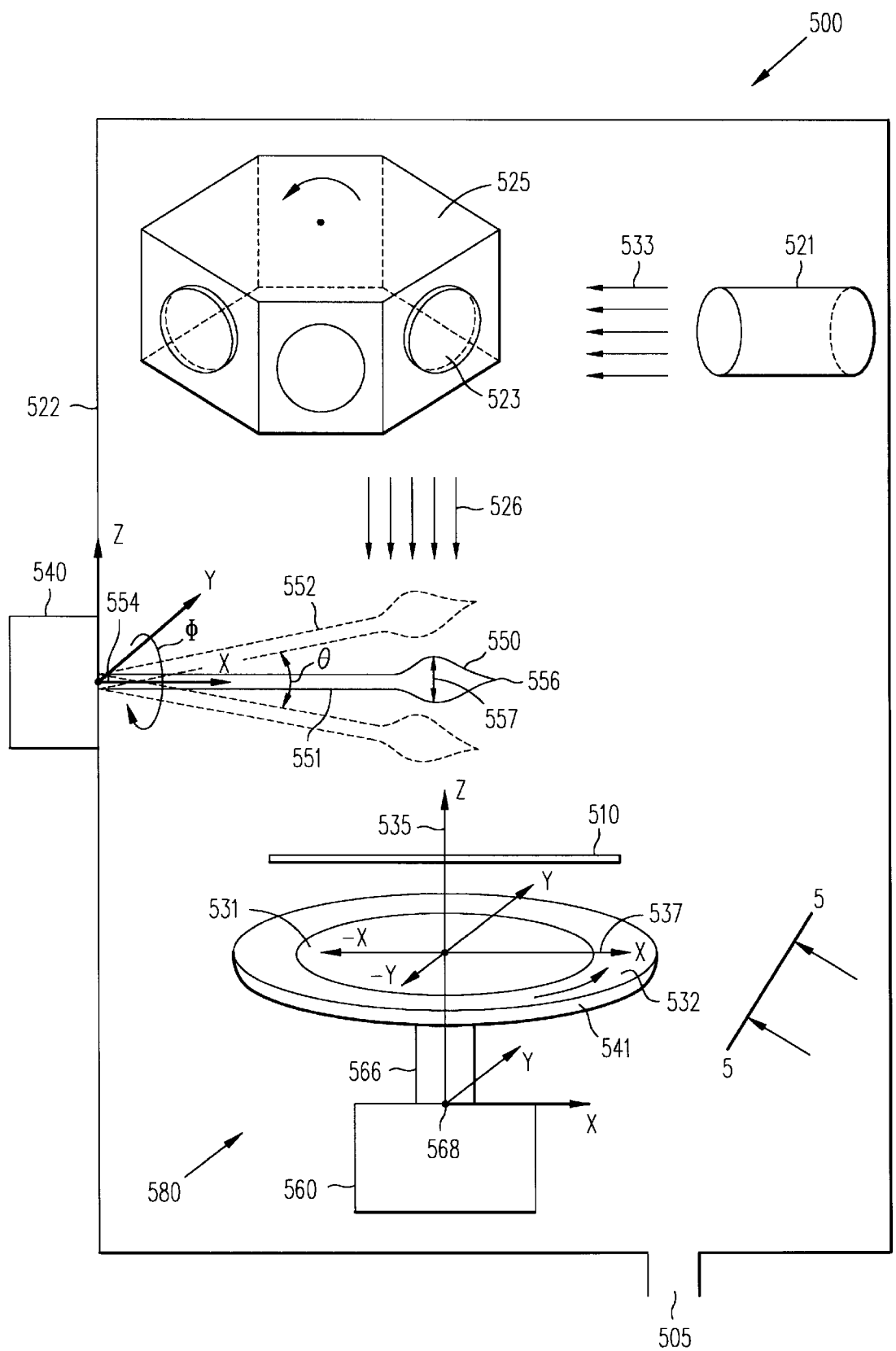
FIG. 10 is a drawing, not to scale, showing a block diagram of an alternative embodiment of the present invention having a tiltable substrate stage.

Referring now to FIG. 10, there is shown a schematic for an alternative ion beam system 500 of the present invention having a stage subsystem 580. Stage subsystem 580 comprises a substrate stage 541 connected to a stage shaft 566 which is in turn connected to a stage controller 560. Stage controller 560 in turn is connected to the control system 570 (not shown). In this embodiment, shaft 566 may tilt in X-direction, Y-direction or in XY-plane by pivoting about the pivot point 568 (via linear motors) thus causing the tilting of the substrate stage 541. Alternatively, substrate stage 541 may tilt in X-direction, Y-direction or in XY-plane without tilting the stage shaft 566 via mechanical gears positioned inside the stage shaft 566 which are capable of tilting the substrate stage 541. During sputter deposition process, substrate stage 541 is made to rotate via rotating the stage shaft 566 via a rotary motor (not shown). Use of mechanical gears, rotary and linear motors for causing rotational and linear motions are well known in the art.

Figure 11:
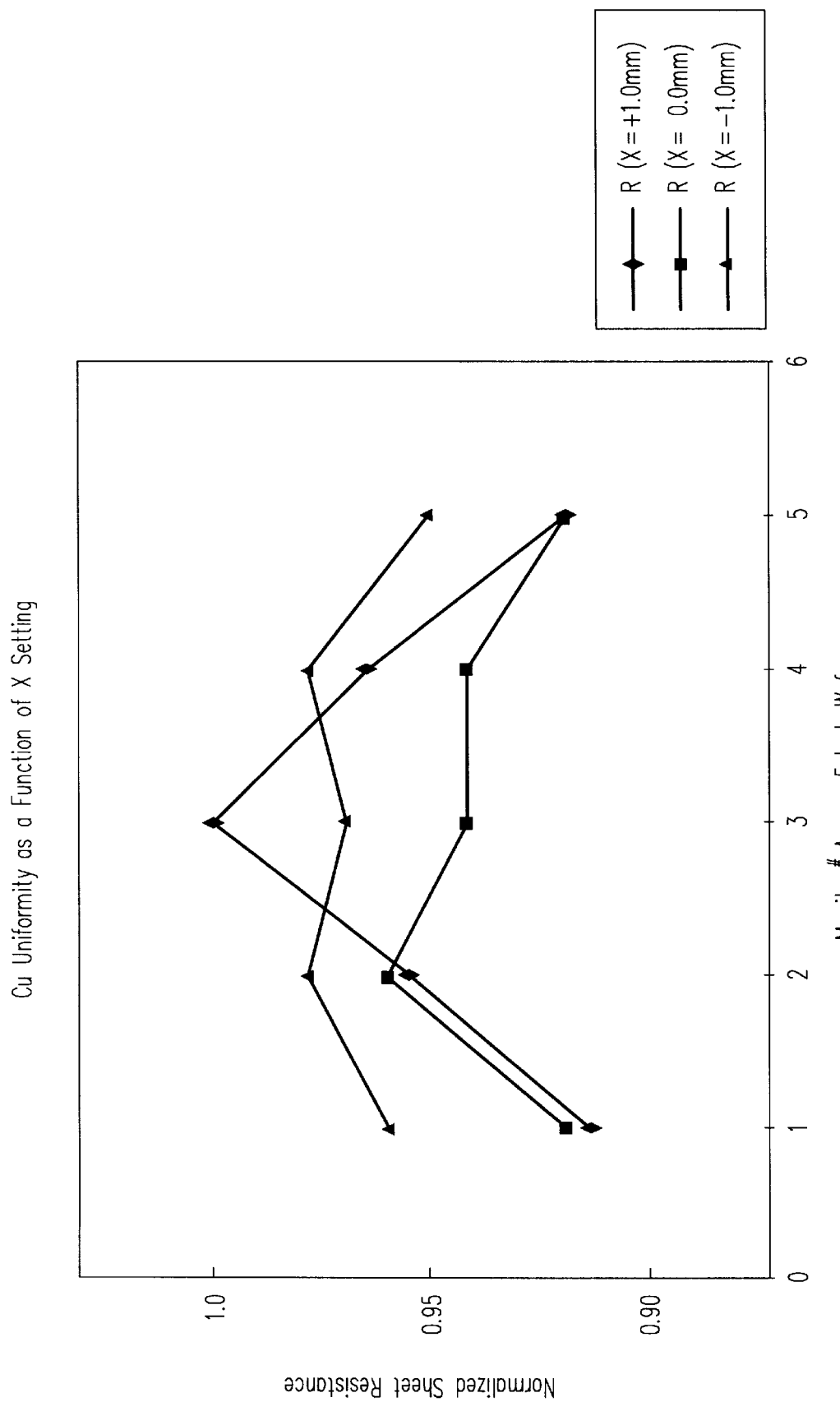
FIG. 11 is a graph showing the copper sheet resistance uniformity across the deposition substrate as a function of X-setting of the movable flux regulator of the present invention.

Referring now to FIG. 11, the effects of X-axis position of the movable flux regulator 550 are shown in graphs of the normalized sheet resistance as a function of location on the workpiece 931 (similar to the substrate 300 shown in FIG. 3 and workpiece 531 shown in FIG. 5) for Cu thin film depositions. It can readily be seen that the Cu film uniformity which is used to form spacer 915, improves significantly from 11.3% to 3.7% as the position of the movable flux regulator is changed from +1.0 mm to −1.0 mm in X direction while holding the position of the movable flux regulator in Y and Z directions the same.

Figure 12:
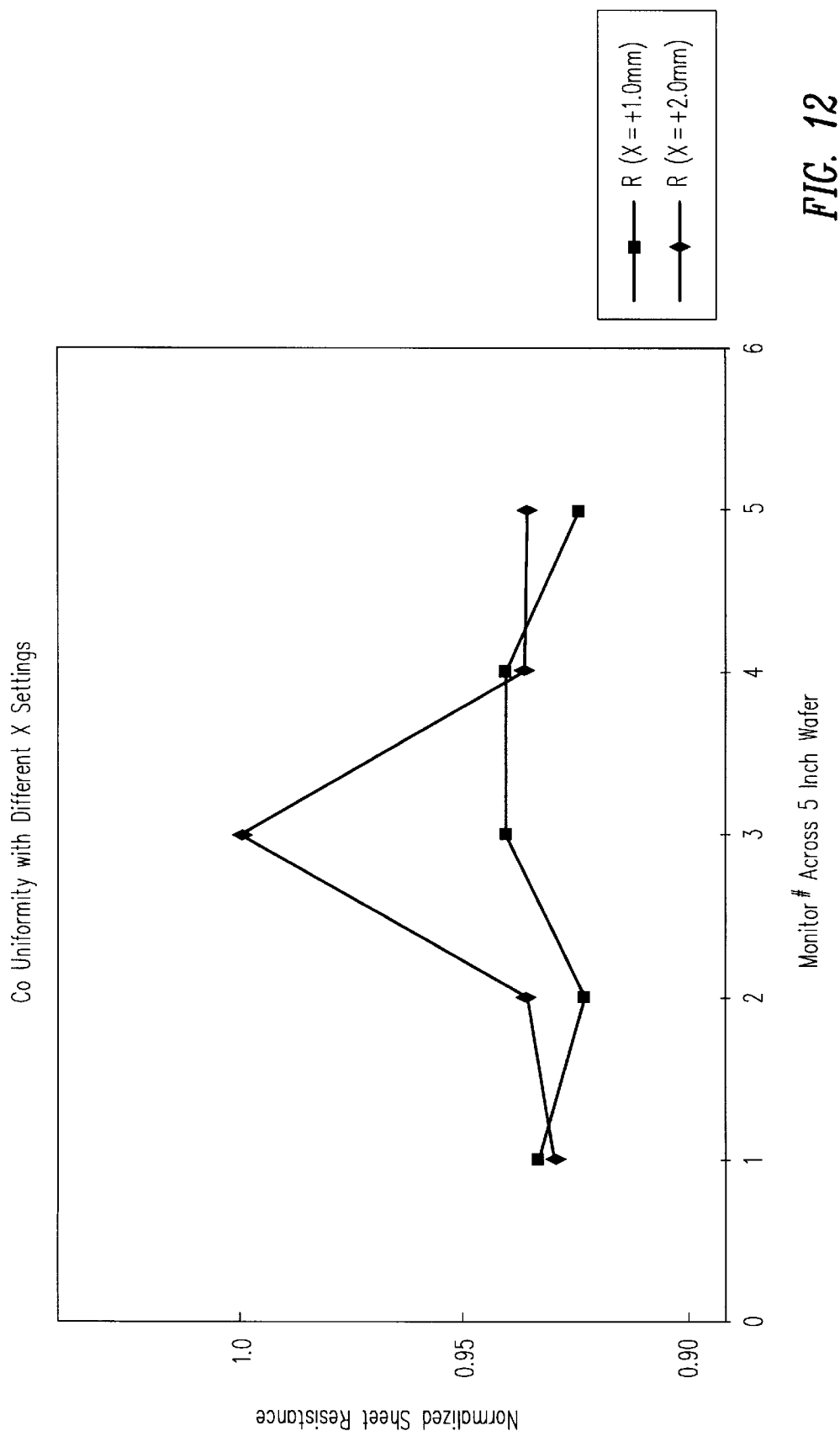
FIG. 12 is a graph showing the cobalt sheet resistance uniformity across the deposition substrate as a function of X-setting of the movable flux regulator of the present invention.

Referring now to FIG. 12, the effects of X-axis position of the movable flux regulator 550 are shown in graphs of the normalized sheet resistance as a function of location on the workpiece for Co thin film depositions. It can readily be seen that the Co film uniformity which is used to form pinned layer 918, improves significantly from 9.0% to 2.7% as the position of the movable flux regulator is changed from +2.0 mm to +1.0 mm in X direction while holding the position of the movable flux regulator in Y and Z directions the same.

Referring back to FIGS. 11 and 12, it can be seen that the X-axis position of the movable flux regulator resulting in improved uniformity of the Cu film is different from the X-axis position of the movable flux regulator resulting in improved uniformity of the Co film.

Note that in order to fabricate an SV sensor, multiple targets 523 should include separate target for each material to be deposited. For the SV sensor 900 described above and illustrated in FIGS. 9A–9F, deposition of the structure in the central region 902 requires targets for the AFM pinning layer (NiO or NiMn or FeMn), the permalloy (NiFe) for pinned MR layer and free MR layer, the Co interface layer, the spacer layer (Cu or gold or silver) and the Ru layer if the pinned layer is an AP-pinned (FM/Ru/FM) layer. The free MR layer material is deposited using the same target as for the ferromagnetic layers of the pinned MR layer. Furthermore, deposition of the structure in the end regions 904 and 906 requires targets for the seed layer of Cr, for the hard bias layer of CoPtCr and for the lead layer of Ta. For each target material, in order to achieve the optimum X-axis setting of the movable flux regulator, an experiment is carried out where a set of thin films are sputter deposited on substrates using a different X-axis setting for the movable flux regulator 550 for each film. The film thickness uniformity of each film is measured across the substrate diameter using an appropriate measure such as, for example, sheet resistance. The graphs of FIG. 11 and 12 show results obtained for Cu films and Co films, respectively. As a result of carrying out the aforementioned experiments, a setting for the X-axis position of the movable flux regulator is chosen which achieves the highest thickness uniformity for each layer of material to be deposited on a wafer substrate. The chosen settings for the movable flux regulator are the settings that will be used during subsequent depositions of the multilayers of the MR sensors.

While the present invention has been particularly shown and described with reference to the preferred embodiment thereof, nevertheless, it will be understood by those skilled in the art that various modifications may be made therein without departing from the spirit, scope, and teaching of the present invention.

For example, although the ion beam system of the present invention was mainly utilized to improve the physical, electrical and magnetic properties as well as thickness uniformity of the layers deposited on a wafer substrate for making MR sensors, the invention is equally applicable to any art that may benefit from improved electrical, physical and magnetic properties and thickness uniformity of an ion beam sputter deposited layer on a substrate.

Furthermore, while a circular substrate stage 541 was utilized in the preferred embodiment of the present invention, an elliptical, square, rectangular, triangular, diamond or any other shape may be used without departing from the spirit of this invention.

Furthermore, although a tilting stage shaft or a rotating and tilting stage arm was used to tilt the substrate stage 541, other schemes may be employed to cause the tilting of the substrate stage without departing from the spirit of this invention.

Accordingly, it is to be understood that the invention disclosed herein is not to be limited by the illustrated embodiment, but only by the scope of the appended claims.

I claim:

1. An ion-beam sputtering deposition system comprising:
   a vacuum chamber;
   a target of material in said vacuum chamber;
   an ion-beam source for directing ions at said target for depositing said target material on a wafer placed in said vacuum chamber;
   a substrate stage for holding said wafer, said substrate stage being capable of tilting in a first direction and in a second direction before or during the deposition of said target material; and
   a movable flux regulator, disposed between said target and said wafer, for partially blocking a portion of said target material from being deposited on said wafer during the deposition of said target material, wherein said movable flux regulator is movable in X-axis, Y-axis and Z-axis directions relative to said wafer.

2. An ion-beam sputtering deposition system comprising:
   a vacuum chamber;
   a target of material in said vacuum chamber;
   an ion-beam source for directing ions at said target for depositing said target material on a wafer placed in said vacuum chamber;
   a movable flux regulator positioned between said target and said wafer for partially blocking a portion of said target material from depositing on said wafer during deposition of said target material, wherein said movable flux regulator is movable in X-axis, Y-axis and Z-axis directions relative to said wafer;
   a shutter positioned between said movable flux regulator and said wafer; and
   a tiltable substrate stage for holding said wafer during the deposition of said target material, said substrate stage being capable of tilting in a first direction and in a second direction before or during the deposition of said target material.

3. The ion-beam sputtering deposition system according to claim 2, wherein said tiltable substrate stage can further rotate about its vertical axis during the deposition of said target material.

4. An ion-beam sputtering deposition system comprising:
   a vacuum chamber;
   a target of material in said vacuum chamber;
   an ion-beam source for directing ions at said target for depositing said target material on a wafer;
   a movable flux regulator positioned between said target and said wafer for partially blocking a portion of said target material from depositing on said wafer during deposition of said target material, wherein said movable flux regulator is movable in X-axis, Y-axis and Z-axis directions relative to said wafer;
   a shutter positioned between said movable flux regulator and said wafer; and
   a tiltable substrate stage for holding said wafer during the deposition process, said substrate stage being capable of tilting in a first direction and in a second direction before or during the deposition of said target material, said tiltable substrate stage having a vertical axis, said tiltable substrate stage forming a non-normal angle with respect to said vertical axis during the deposition of said target material.

5. The ion-beam sputtering deposition system according to claim 4, wherein said tiltable substrate stage further rotates about said vertical axis during the deposition of said target material.

6. An ion-beam sputtering deposition system comprising:
   a vacuum chamber;
   a plurality of targets of materials in said vacuum chamber;
   an ion-beam source for directing ions at said plurality of targets for sequentially depositing a number of said target materials on a wafer;
   a movable flux regulator positioned between said plurality of targets and said wafer during deposition of said target material for controlling the thickness uniformity of each of said number of target materials deposited on said wafer, wherein said movable flux regulator is movable in X-axis, Y-axis and Z-axis directions relative to said substrate; and
   a tiltable substrate stage, said substrate stage being capable of tilting in a first direction and in a second direction before or during the deposition of said target material, said wafer being placed on said tiltable substrate stage during the deposition of said number of target materials, said wafer having a vertical axis, said wafer forming a non-normal angle with respect to said vertical axis during the deposition of said number of target materials on said wafer.

7. The ion-beam sputtering deposition system according to claim 6, wherein said tiltable substrate can further rotate during the deposition of said number of target materials on said wafer.

8. The ion-beam sputtering deposition system according to claim 6, wherein said non-normal angle is adjusted based on the target material being deposited on said wafer.

9. The ion-beam sputtering deposition system according to claim 6 further comprising a rotatable stage for rotating said plurality of target materials.

10. The ion-beam sputtering deposition system according to claim 6 wherein one of said plurality of target materials is copper.

11. The ion-beam sputtering deposition system according to claim 6 wherein one of said plurality of target materials is cobalt.

12. The ion-beam sputtering deposition system according to claim 6 wherein one of said plurality of target materials is Ni—Fe.

13. The ion-beam sputtering deposition system according to claim 6 wherein one of said plurality of target materials is NiMn.

14. The ion-beam sputtering deposition system according to claim 6 wherein one of said plurality of target materials is NiO.

15. The ion-beam sputtering deposition system according to claim 6 wherein one of said plurality of target materials is Ni.

16. The ion-beam sputtering deposition system according to claim 6 wherein one of said plurality of target materials is Ru.

17. The ion-beam sputtering deposition system according to claim 6 wherein one of said plurality of target materials is Ta.

18. The ion-beam sputtering deposition system according to claim 6 wherein one of said plurality of target materials is Cr.

19. The ion-beam sputtering deposition system according to claim 6 wherein one of said plurality of target materials is CoPtCr.

20. A method of building a magnetoresistive sensor on a wafer in an ion-beam sputtering system having a vacuum chamber, a plurality of target materials in said vacuum chamber, an ion-beam source, a movable flux regulator and a tiltable substrate stage for holding said wafer, said substrate stage being capable of tilting in a first direction and in a second direction before or during the deposition of said target material, said method comprising the steps of:

depositing an MR material on said wafer, said MR material including two layers of ferromagnetic material separated from each other by a layer of non-magnetic material;

depositing photoresist material on said MR material followed by patterning and developing said photoresist to create openings in said photoresist material;

removing said MR material exposed through said openings;

sputter depositing atoms of a first target material on said wafer substrate while said wafer substrate is tilted to form a first non-normal angle with respect to its vertical axis; and sputter depositing atoms of a second target material on said first target material while said wafer substrate is tilted to form a second non-normal angle with respect to its vertical axis.

21. The method according to claim 20 wherein said first target material is Cr.

22. The method according to claim 20 wherein said second target material is CoPtCr.

23. The method according to claim 20 further including a step of sputter depositing atoms of a third target material on said second target material while said wafer substrate is tilted to form a third non-normal angle with respect to its vertical axis.

24. The method according to claim 23 wherein said third target material is Ta.

25. An ion-beam sputtering deposition system comprising:

a vacuum chamber;

a substrate stage for holding a wafer substrate, said substrate stage being capable of tilting in a first direction and in a second direction before or during the deposition of said target material to form a non-normal angle with its vertical axis;

a target of material;

an ion-beam source for directing ions at said target for depositing said material on said wafer substrate; and a movable flux regulator, disposed between said target and said wafer substrate during the deposition of said target material, for controlling the uniformity of the target material deposited on said wafer substrate, wherein said movable flux regulator is movable in X-axis, Y-axis and Z-axis directions relative to said substrate.

* * * * *